(12) United States Patent
Vilke et al.

(10) Patent No.: US 11,461,168 B1
(45) Date of Patent: Oct. 4, 2022

(54) DATA LOSS PROTECTION WITH CONTINUITY

(71) Applicant: Amazon Technologies, Inc., Seattle, WA (US)

(72) Inventors: Stephen Daniel Vilke, Bainbridge Island, WA (US); James Morgan Selvidge, Berkeley, CA (US); Rudy Willis, Clayton, CA (US); Paul Hinks, San Rafael, CA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/369,628

(22) Filed: Mar. 29, 2019

(51) Int. Cl.
| | |
|---|---|
| *G06F 11/00* | (2006.01) |
| *G06F 11/08* | (2006.01) |
| *G06F 11/14* | (2006.01) |
| *H03M 13/00* | (2006.01) |
| *H03M 7/30* | (2006.01) |
| *G06F 3/14* | (2006.01) |

(52) U.S. Cl.
CPC .......... *G06F 11/08* (2013.01); *G06F 11/1451* (2013.01); *G06F 11/1464* (2013.01); *G06F 11/1471* (2013.01); *H03M 7/30* (2013.01); *H03M 13/6312* (2013.01); *G06F 3/1454* (2013.01)

(58) Field of Classification Search
CPC .... H03M 13/00; H03M 13/6312; H03M 7/30; H03M 7/6064; H03M 7/6094; H04N 19/00; H04N 19/176; H04N 19/70; G06F 11/08; G06F 11/1451; G06F 11/1464; G06F 11/1471; G06F 3/1454; G06F 3/1462; G06F 9/452; G06F 21/606; G06F 21/64
See application file for complete search history.

(56) References Cited

U.S. PATENT DOCUMENTS

| | | | |
|---|---|---|---|
| 5,486,826 A | * | 1/1996 | Remillard ............... H03M 7/30 341/51 |
| 7,516,255 B1 | * | 4/2009 | Hobbs .................... G06F 3/1454 348/474 |
| 7,573,886 B1 | | 8/2009 | Ono |
| 8,144,255 B2 | | 3/2012 | Hirayama et al. |
| 9,172,740 B1 | | 10/2015 | Jia et al. |

(Continued)

OTHER PUBLICATIONS

IEEE 100 The Authoritative Dictionary of IEEE Standards Terms, Seventh Edition, 2000, IEEE Press, p. 452 (Year: 2000).*

(Continued)

*Primary Examiner* — Michael Maskulinski
(74) *Attorney, Agent, or Firm* — Davis Wright Tremaine LLP

(57) ABSTRACT

Continuity-based data protection may be implemented by systems and methods described herein for collecting a set of data that corresponds to a graphical representation of a computing environment, determining a plurality of subsets of the set of data, wherein a subset of the plurality has mathematical continuity, compressing at least the subset of the plurality, thereby generating one or more compressed subsets, and providing the one or more compressed subset to another computing entity, the other computing entity being able to determine the graphical representation of the computing environment, wherein the graphical representation is presentable to a user of the other computing entity.

20 Claims, 9 Drawing Sheets

(56) References Cited

U.S. PATENT DOCUMENTS

| | | |
|---|---|---|
| 9,311,692 B1 | 4/2016 | Jia et al. |
| 9,401,128 B1 | 7/2016 | Jepsen |
| 9,620,041 B2 | 4/2017 | Liu |
| 9,762,636 B2 | 9/2017 | Price |
| 10,264,070 B2 | 4/2019 | Bradley et al. |
| 10,331,394 B1 | 6/2019 | Sarfi et al. |
| 10,346,715 B2 | 7/2019 | Makarewicz et al. |
| 10,404,963 B1 | 9/2019 | Kenrick |
| 10,735,650 B2 | 8/2020 | Kinoshita |
| 2001/0036308 A1* | 11/2001 | Katayama ............ G06T 9/005 382/166 |
| 2003/0088421 A1 | 5/2003 | Maes et al. |
| 2003/0152034 A1 | 8/2003 | Zhang et al. |
| 2004/0154460 A1 | 8/2004 | Virolainen et al. |
| 2007/0110074 A1 | 5/2007 | Bradley et al. |
| 2007/0217607 A1* | 9/2007 | Thiagarajan ............ H03M 7/46 380/217 |
| 2008/0024599 A1 | 1/2008 | Hirakawa |
| 2008/0052414 A1 | 2/2008 | Panigrahi et al. |
| 2008/0137755 A1 | 6/2008 | Onur et al. |
| 2008/0198930 A1* | 8/2008 | Matsubayashi ...... H04N 19/136 375/240.15 |
| 2008/0198931 A1 | 8/2008 | Chappalli et al. |
| 2008/0278445 A1 | 11/2008 | Sweetser et al. |
| 2009/0100493 A1 | 4/2009 | Jones et al. |
| 2009/0210817 A1 | 8/2009 | Schmieder et al. |
| 2009/0241110 A1 | 9/2009 | Heo et al. |
| 2009/0284442 A1 | 11/2009 | Pagan |
| 2009/0285217 A1 | 11/2009 | Frink et al. |
| 2010/0045690 A1 | 2/2010 | Handschy et al. |
| 2010/0046623 A1 | 2/2010 | Chen et al. |
| 2010/0091042 A1 | 4/2010 | Inoue |
| 2010/0128054 A1 | 5/2010 | Manabe |
| 2010/0164839 A1 | 7/2010 | Lyons et al. |
| 2010/0198575 A1 | 8/2010 | Hollis |
| 2010/0231738 A1 | 9/2010 | Border et al. |
| 2010/0231800 A1 | 9/2010 | White et al. |
| 2010/0254603 A1 | 10/2010 | Rivera |
| 2010/0256344 A1 | 10/2010 | Thompson et al. |
| 2011/0032419 A1 | 2/2011 | Sakaniwa et al. |
| 2011/0043806 A1 | 2/2011 | Guetta et al. |
| 2011/0141372 A1 | 6/2011 | Kato et al. |
| 2011/0209064 A1 | 8/2011 | Jorgensen et al. |
| 2011/0228984 A1 | 9/2011 | Papke et al. |
| 2011/0231419 A1 | 9/2011 | Papke et al. |
| 2012/0226742 A1 | 9/2012 | Momchilov et al. |
| 2012/0257671 A1 | 10/2012 | Brockmann et al. |
| 2012/0257836 A1* | 10/2012 | Yu ............ H04N 19/507 382/232 |
| 2012/0314599 A1 | 12/2012 | Vilke et al. |
| 2012/0324365 A1 | 12/2012 | Momchilov et al. |
| 2013/0033618 A1 | 2/2013 | Kato et al. |
| 2013/0044885 A1 | 2/2013 | Master et al. |
| 2013/0055102 A1 | 2/2013 | Matthews et al. |
| 2013/0064289 A1 | 3/2013 | Chernyshev et al. |
| 2013/0163428 A1 | 6/2013 | Lee et al. |
| 2013/0185633 A1 | 7/2013 | Bunker et al. |
| 2013/0215290 A1 | 8/2013 | Solhusvik et al. |
| 2013/0219012 A1 | 8/2013 | Suresh et al. |
| 2014/0043349 A1 | 2/2014 | Parmar et al. |
| 2014/0188977 A1 | 7/2014 | Song et al. |
| 2014/0244863 A1 | 8/2014 | Bradley et al. |
| 2014/0282753 A1 | 9/2014 | Li et al. |
| 2014/0359494 A1 | 12/2014 | Clark |
| 2015/0117545 A1 | 4/2015 | Fu et al. |
| 2015/0125032 A1 | 5/2015 | Yamanaka et al. |
| 2015/0199074 A1* | 7/2015 | Wu ............ G06F 3/0481 715/794 |
| 2015/0215753 A1 | 7/2015 | Leipzig et al. |
| 2015/0244812 A1 | 8/2015 | Brunson et al. |
| 2015/0244940 A1 | 8/2015 | Lombardi et al. |
| 2015/0254726 A1 | 9/2015 | Cassidy et al. |
| 2015/0350555 A1 | 12/2015 | Nishi |
| 2016/0127432 A1 | 5/2016 | Privat |
| 2016/0133224 A1 | 5/2016 | Nakajima |
| 2016/0189393 A1 | 6/2016 | Rao et al. |
| 2016/0218986 A1 | 7/2016 | Klemetti et al. |
| 2016/0219218 A1 | 7/2016 | Kinoshita |
| 2016/0246560 A1 | 8/2016 | Petrov |
| 2017/0034542 A1 | 2/2017 | Yabu |
| 2017/0054793 A1 | 2/2017 | Urbach |
| 2017/0104909 A1 | 4/2017 | Nakajima |
| 2017/0141906 A1 | 5/2017 | Rainish |
| 2017/0150045 A1 | 5/2017 | Goswami et al. |
| 2017/0256281 A1 | 9/2017 | Hoarty |
| 2017/0279757 A1 | 9/2017 | Kereth et al. |
| 2017/0365237 A1 | 12/2017 | Koneru et al. |
| 2018/0027167 A1 | 1/2018 | He et al. |
| 2018/0054481 A1 | 2/2018 | Bradley et al. |
| 2018/0158424 A1 | 6/2018 | Okamoto et al. |
| 2018/0242920 A1 | 8/2018 | Hresko et al. |
| 2018/0332132 A1 | 11/2018 | Sampath et al. |
| 2019/0005351 A1 | 1/2019 | Zhou et al. |
| 2019/0012531 A1 | 1/2019 | Radwin et al. |
| 2019/0029543 A1 | 1/2019 | Hutchinson et al. |
| 2019/0054377 A1 | 2/2019 | Nelson et al. |
| 2019/0141351 A1* | 5/2019 | Alakuijala ............ H04N 19/82 |
| 2019/0156785 A1 | 5/2019 | Marchya et al. |
| 2019/0281206 A1 | 9/2019 | Lee et al. |
| 2019/0302881 A1 | 10/2019 | Chan et al. |
| 2020/0059643 A1 | 2/2020 | Marchya et al. |
| 2020/0257807 A1 | 8/2020 | Chen |

OTHER PUBLICATIONS

Dehariya et al., "Clustering of Image Data Set Using K-Means and Fuzzy K-Means Algorithms", IEEE, 2010 International Conference on Computational Intelligence and Communication Networks, pp. 386-391 (Year: 2010).*

International Search Report and Written Opinion, dated Feb. 26, 2020, International Patent Application No. PCT/US2019/066070, filed Dec. 12, 2019.

International Search Report and Written Opinion, dated Feb. 26, 2020, International Patent Application No. PCT/US2019/066072, filed Dec. 12, 2019.

Wikipedia, "IEEE 802.11," page last modified Feb. 7, 2017, retrieved Feb. 13, 2017, from https://en.wikipedia org/wiki/IEEE_802.11, 9 pages.

Wikipedia, "IEEE 802.16," page last modified Nov. 21, 2016, retrieved Feb. 13, 2017, from https://en.wikipedia.org/wiki/IEEE_802.16, 8 pages.

Wikipedia, "IEEE 802.21," page last modified Aug. 4, 2016, retrieved Feb. 13, 2017, from https://en.wikipedia.org/wiki/IEEE_802.21, 3 pages.

* cited by examiner

DATA LOSS PROTECTION WITH CONTINUITY

BACKGROUND

In various contexts, managing the integrity of transmitted data is important. Organizations, for example, often utilize networks of computing devices that are interconnected to communicate with other devices and clients. Organizations may transmit and receive data across networks such as the Internet. The communications often use networks that connect with other networks, and often span multiple geographic regions. As the size and complexities of such networks grow, managing the integrity of transmitted data between devices can be increasingly difficult.

When data is transmitted across a medium (e.g., over fiber or copper wires, wirelessly as an electromagnetic wave) the signal encoding the data may be subjected to various types of loss. For example, different types of stochastic loss may include random loss such as spectral interference, multipath interference/loss, ionospheric interference/loss, and/or variations thereof. As a second example, a malicious party may subject a network to a denial-of-service (DOS) or distributed denial-of-service (DDOS) that renders a network or a portion of the network unable to transmit data from a source to a destination. Thus, data that is transmitted from a source computing entity to a destination computing entity may fail to be received or may be damaged during transmission such that some or all data of the transmission is altered. Data protection techniques may be utilized to repair data that is damaged and/or lost during transmission.

Accordingly, there are various challenges surrounding data loss protection within the context of computer networks. One approach to data loss protection is the utilization of error correction algorithms such as forward error correction (FEC) or channel coding. However, the use of FEC introduces additional technical challenges. The utilization of FEC requires additional computational resources of a computer system in order to generate a code that provides error correcting capabilities. In many cases, such as those in which data must be transmitted within predefined time constraints (e.g., real-time data streams) the additional computational resources required by error correction algorithms may be unacceptable. In real-time systems and real-time data transmission, computer systems may be instructed to provide data within certain time-based requirements (e.g., at a rate of 30 hertz) which makes the use of computing resources to generate additional data (e.g., error codes) unacceptable.

BRIEF DESCRIPTION OF THE DRAWINGS

Various techniques will be described with reference to the drawings, in which.

DETAILED DESCRIPTION

Figure 1:
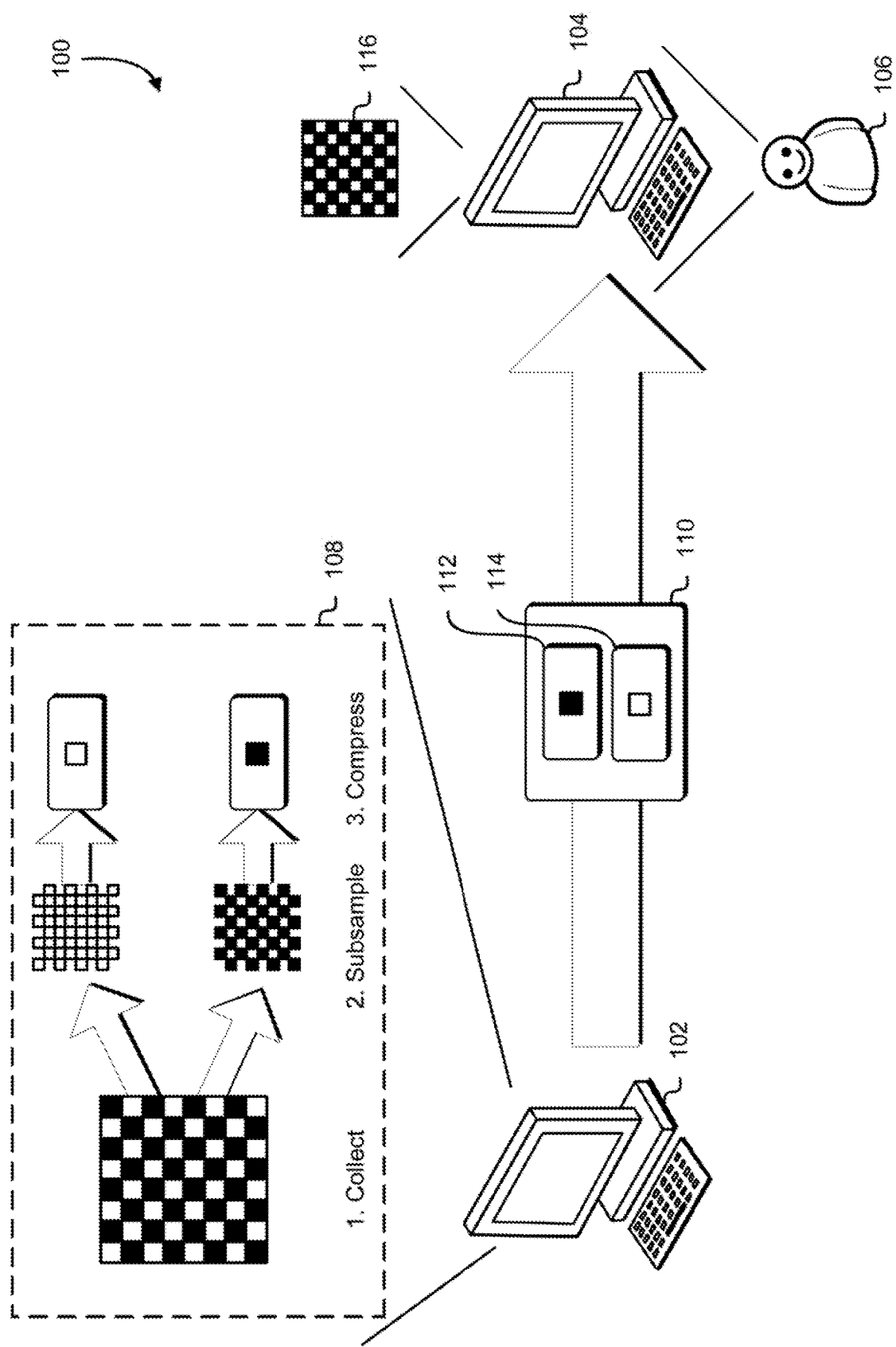
FIG. 1 illustrates a system in which various embodiments can be implemented.

Various types of loss protection techniques may be applied to data as part of a protection scheme. The protection of data may refer to the algorithms, routines, transmission methods, etc., that ensure data transmitted from one computing entity (e.g., a source) to a second computing entity (e.g., a destination) is properly received. For example, error correction codes may be utilized. With error correcting techniques such as forward error correction (FEC), an entity (e.g., computer system running executable code, human operator controlling a computer system) is able to choose and parameterize how much loss protection to have relative to an increase in size of the data payload.

For example, for a message M having a size $S_M$, an error correction code E may be generated having a size $S_E$ where $S_M \geq S_E$. In particular, $S_M = S_E$ may be achieved by simply sending the message M twice—that is, the redundancy technique involves sending the message twice $\{M, M\}$ such that loss of one message or a portion thereof can be repaired using the redundant copy. In general, though, FEC and other types of error correction techniques may be able to provide data loss protection using a smaller overhead than total data duplication. Techniques such as FEC may generate metadata overhead that is proportionally smaller than full data duplication so as to be more scalable than total data duplication. In this sense, FEC may be considered a data transmission optimization to re-encode data in a manner that uses less overhead.

In general, error correction techniques are data-agnostic, in the sense that the same techniques may be applied to a first datagram $M_1$ and a second datagram $M_2$ regardless of the data contents of $M_1$ and $M_2$—for example, $M_1$ may be an image and $M_2$ may be a text document. While the amount of data optimization that can be achieved with different types and contents of data, conventional error correction techniques may be applicable to all types of data—in other words, various error correction techniques such as FEC are data-agnostic error correction techniques.

Continuity-based data protection techniques are described throughout this disclosure. Continuity-based data protection techniques may be data-dependent (i.e., not data-agnostic so as to be applicable to arbitrary data). Data-dependent error correction techniques may be dependent on the underlying data being protected and exploit properties of the specific data to achieve data redundancy and/or protection greater than that of data-agnostic techniques and/or achieve the same level of redundancy with lower overhead. Accordingly, one skilled in the art will appreciate in light of this disclosure, certain embodiments may be capable of achieving certain advantages, including some or all of the following: improved efficiency, reduced data usage, improved performance, and more. Furthermore, some types of communications, such as data streams transmitted under real-time communications constraints, may not be achievable using conventional error correction techniques but are achievable by utilizing data protection with continuity as described in this disclosure.

Continuity—also referred to as mathematical continuity—may refer to similarities between different data elements of a set of data. For example, a subset of a set of data may exhibit mathematical continuity if it includes similar or identical data. For example, mathematical continuity may be present in pictures where the color of some parts of the picture may be correlated to nearby pixels. Mathematical continuity may be present in GUI elements which tend to have lines and high-contrast elements.

A type of data-dependent data protection technique is a continuity-based data protection technique. In particular, the property being exploited is whether data has continuity. Continuity of data may refer to mathematical continuity. For example, an image such as a photograph typically has a high degree of continuity; a desktop image tends to have a high degree of continuity either because it has regions of constancy or regions of smoothness such as in an image or video being displayed on the desktop. When it is said that data has continuity, it may mean that in a given local area (e.g., in a portion of a screen, which may be viewed as a subset of a set of data) the elements in that area roughly predict each other (e.g., because they are locally similar). This is, as stated previously, based on the concept of mathematical continuity.

Generally speaking, data-agnostic data protection techniques do not necessarily make any assumptions as to whether the contents of the data exhibit continuity. In contrast, a continuity-based data protection routine or algorithm may analyze data to be protected to determine the degree to which the data is continuous. For example, there may be a high degree of continuity of particular regions of a checkerboard pattern (e.g., between the light colored squares and between the dark colored squares). The regions of continuity may be non-contiguous, the checkerboard example being merely one example of an interlaced pattern in which there is a high degree of continuity. By subsampling data that exhibits a high degree of continuity, data sets may be determined such that representatives in regions (e.g., the representative including less than the entire region) to break down an individual original data input set into a number of subsampled subsets. A data set (e.g., an image) may be decomposed into interlaced bits or regions and the subsets of the data set may be separately compressed. For example, if an image is decomposed into two interlacing images, there may be additional overhead in the amount of header data or metadata that is needed to reconstruct the interlaced image. However, the increase in overhead may be offset by achieving a greater compression ratio by compressing the subset of the data, which may be attributable at least in part to selecting a subset to have a high degree of mathematical continuity. Accordingly, compression efficiency may be realized. With techniques described herein, it is possible to accommodate a 25% loss image with little or no visual degradation at high-definition video quality (e.g., 720p resolution at 30 frames per second) with a 10% or less increase in bandwidth usage.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

FIG. 1 illustrates a computing environment 100 in which various embodiments can be implemented. The computing environment 100 illustrates a first computing entity 102 and a second computing entity 104 in which the first computing entity 102 is configured with computer-readable instructions to perform a continuity-based data protection routine. The routine may be performed to increase performance, which may be measured using various metrics such as a faster runtime (e.g., as compared to conventional techniques), reduced overhead, reduced overall data transmission over a network, and more.

The first computing entity 102 may be any suitable computing entity implemented using hardware, software, or a combination thereof. In some embodiments, the first computing entity executes a remote desktop computing environment which can be controlled by the second computing entity 104 via a network such as the Internet. The first computing entity 102 may be a computing resource service provider or a portion thereof. In some embodiments, a computing resource service provider provides a computing environment on behalf of a consumer such as a user or virtual or remote computing environment that is configured with an operating system, applications, etc., which can be specified by a consumer (e.g., user) via a network. In general, the first computing entity 102 may be any suitable computing entity that is configured with or having stored thereon computer-executable instructions that, as a result of execution by one or more processors of the first computing entity, cause the first computing entity to perform data protection techniques such as continuity-based data protection processes described herein above and below, such as those discussed in connection with FIG. 8 in greater detail below. As an example, the first computing entity 102 may be a personal computing device such as—or such as a virtualization of—a laptop, desktop computer, home server, smartphone, tablet, etc., under the control of an end-user that is configured with executable instructions described in connection with FIG. 8. The first computing entity 102, in an embodiment, is a remote desktop service provided as capability or service of a computing resource service provider. The first computing entity 102 may be and/or may utilize computing resources and techniques described in connection with the second computing entity 104.

The second computing entity 104 may be any suitable computing entity implemented using hardware, software, or a combination thereof. In an embodiment, the second computing entity 104 is a personal computing device that a user 106 directly interacts with. A user, in an embodiment, is an example of a consumer of multimedia content such as graphical and/or audio content. Direct interaction, in this context, may refer to the user physically using the second computing entity, such as a laptop computer that the user physically controls using various input devices such as a keyboard, mouse, touchscreen, and more. In various embodiments, the second computing entity 104 has an output device such as a monitor or graphics port for displaying graphical data via an output device such as a monitor, projector, etc. such that graphical data (e.g., in the form of compressed subsets of interlaced image data) received by the second computing entity 104 can be parsed and displayed. The graphical data may be rendered on a graphical output device such as an electronically rendered screen, of which non-limiting examples include projector technologies, monitor technologies based on liquid crystal display (LCD), and more. The second computing entity 104 may be and/or may utilize computing resources and techniques described in connection with the first computing entity 102.

The user 106 may refer to a consumer, which may be an entity that is capable of interpreting continuity. For example, the entity may be a human end-user that is able to interpret various forms of continuity. Interpretation of continuity may allow an end-user to recognize equivalency and/or approximation of a first set of data and a second set of data. For example, the user 106 may have processing capabilities for identifying whether two sets of data are sufficiently similar to one another. For example, in data sets with high continuity, it may be the case that two data sets which are different are sufficiently similar, such as in the case of a mouse cursor movement diagonally across a screen may be considered sufficiently similar. In this case, a first set of data may represent an approximately diagonal movement of a cursor across a GUI:

| |
|---|
| (2, 2) |
| (4, 4) |
| (6, 6) |
| (9, 7) |
| (10, 10) |

This first data set may be processed by the user 106 against a second data set having strictly diagonal movement:

| |
|---|
| (2, 2) |
| (4, 4) |
| (6, 6) |
| (8, 8) |
| (10, 10) |

The user 106 may identify that the first data set and second data set described above as sufficiently similar and determine that the second data set is a valid approximation of the first data set. Other criteria may be involved in concluding whether an approximation is valid, such as the rate at which the cursor is moving (e.g., more tolerance to jagged movements when cursor is moving quickly) and contextual information. An example of utilizing contextual information may be if there is an image or other graphical data that the cursor occludes, which may indicate that the user is tracing the outline of an image which may or may not be a perfectly horizontal line.

In some embodiments, the user 106 uses an input device such as a pointing device or touch screen to control the second computing entity 104. The second computing entity 104 may be configured with a plugin, application, or other executable instructions to control a remote desktop application being executed on the first computing entity 102 and the user's commands are executed in the remote computing environment.

FIG. 1 further illustrates continuity-based data protection 108 which may be a process implemented using computer hardware and/or software of a computing entity such as the first computing entity 102. In the context of a distributed computing environment, a process for continuity-based data protection 108 may be collectively executed by computing resources of the distributed computing environment, such as by multiple processors of multiple computing entities. In a distributed computing environment, a process such as a process for continuity-based data protection 108 can be initially executed in a first computing environment (e.g., on a first virtual machine instance) and completed using resources of a second, different computing environment. For example, multiple compute instances may be used to collectively execute the routine in the following manner: a snapshot of the first virtual machine is captured, the virtual machine instance is suspended, and the snapshot is loaded and execution resumed on a second, different virtual machine instance.

An illustrative example of a continuity-based data protection technique is illustrated in FIG. 1, which illustrates the example of an image of a checkerboard. The checkerboard image may be rendered as graphics in a graphical user interface to be represented to the user 106, for example, as graphics rendered on the second computing entity 104. The checkerboard graphics may be collected by the first computing entity as a data set that is representable to a consumer (e.g., user). The collected graphical data may be rasterized graphics, vector graphics, and more, for example. The checkerboard pattern can be subsampled down to a first subset of the black squares and a second subset of the white squares. In an embodiment, the image is analyzed to identify multiple subsets which are orthogonal in the sense that one subset does not include data from another subset in order to be parsed and/or rendered by a recipient. In some embodiments, the subsets are contiguous regions of captured graphics. In an embodiment, the subsets include non-contiguous regions. FIG. 1 illustrates an example of non-contiguous regions in which black square and white squares are assigned to different subsets and those subsets can be interlaced to reproduce the original image. Reproduction in this context may refer to perfectly re-creating the state and/or changes in state of the first computing entity to the second computing entity. The state may refer to various types of state, such as graphical state (e.g., location of icons, windows, graphics in a GUI) and non-graphical state (e.g., text being entered into a command-line interface).

Regarding continuity, a consumer such as a user viewing the subsampled image would be able to identify the representation of the data. The identification may be data-dependent in the sense that certain types of data may lack continuity (e.g., text) whereas photos or a picture would have higher continuity in the original data set. If there is continuity in the data set, the consumer can discern the continuity because the sets are sufficiently similar to each other. In some embodiments, the set of data (e.g., an image or collection of images) is split up into fractions of the original (e.g., into two or four regions) thereby enabling an ability to express the original data set in a way that exhibits higher loss resistance because the dependency of the data has new bounties. In an embodiment, rather than having one boundary for the original data of the beginning and end of the input, subsample, any subsample, which is a higher degree of reconstruction, may have independently parsable boundaries that can be identified and recognized. For example, if a subset among a plurality of subsets is complete, it can be parsed and an effort may be made to present the original data set. This may work specifically where the presentation of the data can appeal to continuity, which can be leveraged to make use of the fact that using continuity to represent an appropriate approximation of the original data can be adequate to the consumer of the content. Each subsampled region or subset of the data set can be individually compressed and subsequently transmitted to a recipient as a plurality of compressed subsets 110. The plurality of compressed subsets may, generally speaking, be transmitted in any suitable manner and may be transmitted according to a communications protocol that does not necessarily require total sequential completeness. For example, a Transmission Control Protocol (TCP) based protocol may require total sequential completeness while a User Datagram Protocol (UDP) based protocol does not require total sequential completeness. Generally speaking, a protocol may require assurances of total sequential completeness where there are requirements with regard to the dependency of a first data with a second data. For example, in TCP, it may be the case that the ability to process a first data packet (e.g., having a sequence number "123") is dependent on having received a second data packet (e.g., a preceding data packet with a sequence number less than that of the first data packet such as "9", "17", "83", "100" or "122"). Conversely, local sequential completeness may refer to an individual data packet (or, in some cases, a set of data packets) including sufficient data for a recipient to begin parsing the data packet.

Representation of a data source may refer to various types of representation, such as a true representation, approximate representation, etc. A true representation—which may alternatively be referred to as a recreation—may refer to a representation of a data source which is true to the original. In some embodiments, this refers to a bit-by-bit comparison between the representation and the original. In some cases, a true representation refers to synchronization between different regions of the representation—for example, if a data source has a mouse cursor moving from (0,0) to (10,0) over the same timeframe that a video plays from 0:00 to 0:01, a true representation may include the mouse movement from (0,0) to (10,0) and a compressed version of the video that is rendered on a client computer system based on original data that is compressed and transmitted by a server to the client.

An approximate representation may refer to a representation of a data set that may include altered timings, altered data, or other elements of the original data set that are altered specifically to appeal to continuity. As an example, an approximate representation of a graphical data source (e.g., remote desktop) may be subsampled into multiple regions and data from the different regions may be de-synchronized. For example, the timing to which a mouse cursor moves from (0,0) to (10,0) may differ from the timing of the playback for video when it is determined that there is no correlation between the cursor movement and the video. As a second example, if a user is typing text in one region of the screen and a video is playing in another region unrelated to the typing text, the region with the video may be buffered and subjected to greater latencies as compared to the region with the text. As a second example, an approximate representation may be appropriate in cases where there is rapid movement of text and images, such as when a user scrolls through a file browser with image thumbnails and the image names. The image names—in text—may be prioritized so that they are rendered clearly while the images may be compressed or replaced with placeholder thumbnails until scrolling slows or stops. Once at a steady state, the thumbnail may be further rendered with higher quality. In this sense, the user experience of scrolling through a remote desktop may be improved because the user is still able to clearly see the filenames associated with the images which will be rendered when scrolling slows down sufficiently.

In an embodiment, a computing entity is a computer system which can be a distributed and/or virtual computing system utilizing several computer systems and components that are interconnected via communication links (e.g., transmission control protocol (TCP) connections and/or transport layer security (TLS) or other cryptographically protected communication sessions), using one or more computer networks or direct connections. However, it will be appreciated by those of ordinary skill in the art that such a system could operate in a system having fewer or a greater number of components than are discussed throughout this disclosure. Thus, the depiction of systems in FIG. 1 should be taken as being illustrative in nature and not limiting to the scope of the disclosure.

For example, the checkerboard pattern illustrated in FIG. 1 can be subsampled into interlaced regions of white and black squares. The subsampled region of black squares may be compressed as a first subset to generate a compressed first subset 112. Since there is high continuity between the black squares, it may be the case that the compression ratio for compressing the subset may be higher than the compression ratio that would be achieved by compressing the entire data set (i.e., in this example, the entire checkerboard). Likewise, the white squares may be subsampled as a second region and compressed, thereby generating a compressed second subset 114 of the data set. It should be noted that while there can be overhead and metadata associated with each compression, the improvement to compression ratio of each subset can offset the penalty of having to generate more metadata.

The compressed first subset 112 and the compressed second subset 114 discussed in connection with FIG. 1 may be transmitted to across a network using a network protocol such as UDP. Generally speaking, the communications protocol may be a protocol that does not provide technical assurances of total sequential completeness such as a communications channel that utilizes UDP. Compressed subsets may be transmitted over a network as UDP datagrams. In an embodiment, a subset of data (e.g., compressed or uncompressed) has local sequential completeness such that a recipient of the subset is able to begin parsing the subset immediately without waiting for additional data to be received. For example, the compressed first subset 112 may be received independently of the compressed second subset 114 and the black checker squares may be rendered on a screen immediately, independently of when or whether the compressed second subset 114 is received. The compressed second subset 114, upon being received, may be compressed and interlaced with the regions of the black squares so as to generate a graphical representation 116 of the original data set (e.g., the checkerboard pattern) at the second computing entity 104. The resulting graphical representation 116 may be rendered to the user 106 using an output device such as by using projector or display technology.

In an embodiment, a client (e.g., client of a video streaming service) uses software to capture multimedia from one or more sources (e.g., the applications being run on the client's computer, video/audio content from the client's webcam) and submits such data to a service. In an embodiment, the server processes the data submitted by the client and submits datagram to other clients of the service. In an embodiment, the client is a host or content generator and the other clients are viewers (e.g., other clients are passive consumers of the content). In an embodiment, the client and the other clients are collaborators—such as in the case of a shared document or shared desktop environment that each of the client and the other clients (or subsets thereof) are able to submit commands to. Accordingly, there may be a many-to-one relationship between the views and the host.

Figure 2:
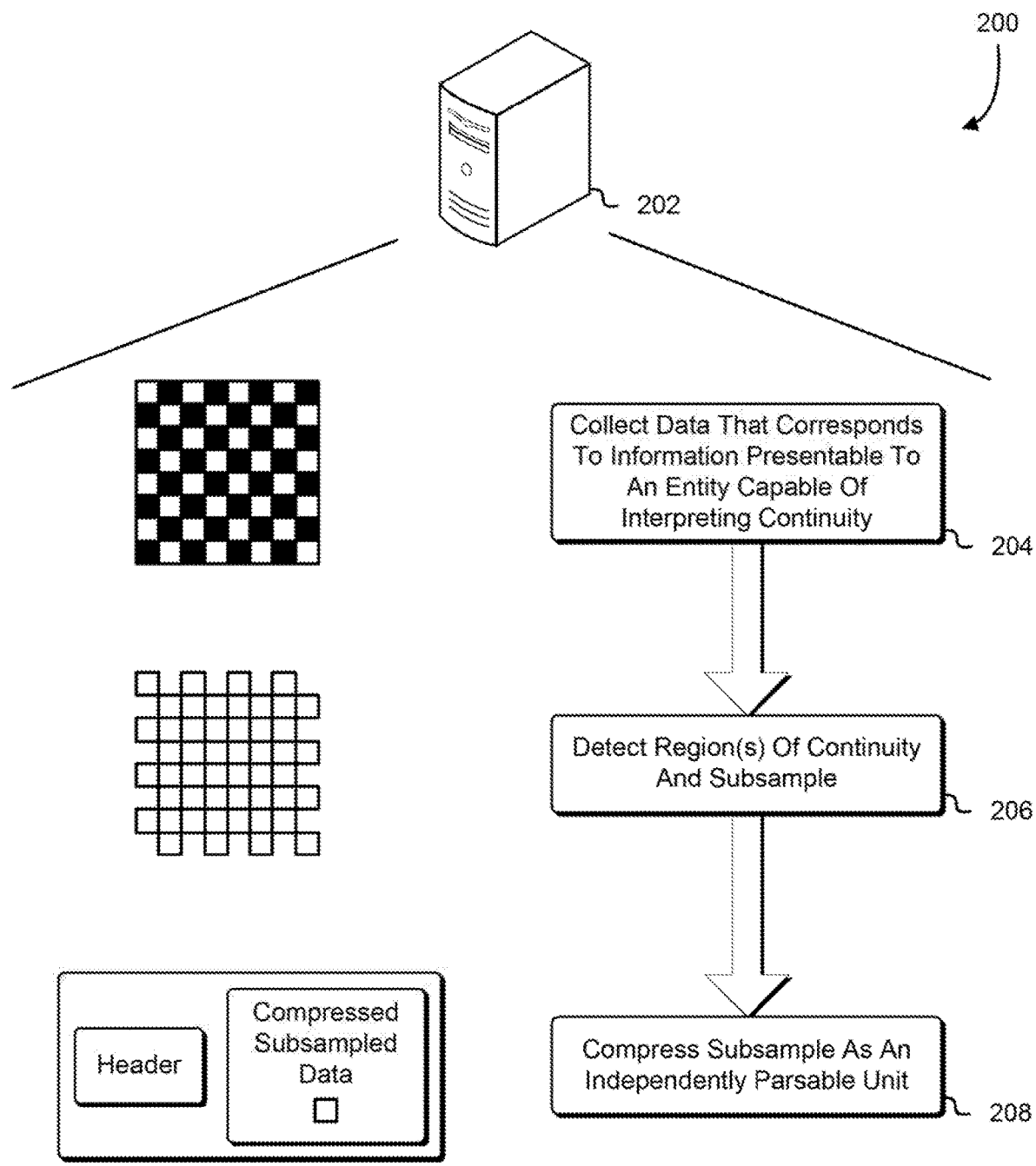
FIG. 2 illustrates a computing environment 00 in which a computing entity performs a continuity-based data protection routine, in accordance with at least one embodiment.

FIG. 2 illustrates a computing environment 200 in which various embodiments can be implemented. The computing environment 200 illustrates a computing entity 202 performing a continuity-based data protection routine. The routine may be performed by any suitable computing entity, such as those described in connection with FIGS. 1 and 3-@@@. The process described in connection with FIG. 8 may be implemented at least in part by the computing environment 200 illustrated in FIG. 2.

FIG. 2 illustrates aspects of an example computing environment 200 for implementing aspects in accordance with an embodiment. A web-based system may used for purposes of explanation. However, different systems may be used, as appropriate, to implement various embodiments. In an embodiment, the computing entity 202 is implemented by hardware, software, or a combination thereof. In an embodiment, the computing entity includes an electronic client device, which includes any appropriate device operable to send and/or receive requests, messages, or information over an appropriate network and convey information back to a user of the device. Examples of such client devices include personal computers, cellular or other mobile phones, handheld messaging devices, laptop computers, tablet computers, set-top boxes, personal data assistants, embedded computer systems, electronic book readers, and the like.

The computing entity 202 may be a computer server of a computing resource service provider that hosts a virtualized computing environment that a client computer system of the computing resource service provider is able to connect to. As an example, the computing resource service provider may provide various types of computing environments such as a computing environment provisioned based on parameters specified by a client such as parameters that specify an operating system and software applications that the client is able to control (e.g., remotely, via a network such as the Internet). The computing entity 202 may include components to generate and/or render video graphics. In some cases, the computing entity 202 is a computer system that includes an input device that a human user is able to use to input commands (e.g., a keyboard or touchscreen) and an output device such as a monitor or graphics port for displaying graphical data via an output device such as a monitor, projector, etc. These are merely illustrative examples of input and output devices, and more non-limiting examples are described throughout this disclosure.

In an embodiment, the illustrative system includes at least one application server and a data store and it should be understood that there can be several application servers, layers or other elements, processes or components, which may be chained or otherwise configured, which can interact to perform tasks such as obtaining data from an appropriate data store. Servers, in an embodiment, are implemented as hardware devices, virtual computer systems, programming modules being executed on a computer system, and/or other devices configured with hardware and/or software to receive and respond to communications (e.g., web service application programming interface (API) requests) over a network. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered system. Data stores, in an embodiment, communicate with block-level and/or object level interfaces. The application server can include any appropriate hardware, software and firmware for integrating with the data store as needed to execute aspects of one or more applications for the client device, handling some or all of the data access and business logic for an application.

The data store, in an embodiment, includes several separate data tables, databases, data documents, dynamic data storage schemes and/or other data storage mechanisms and media for storing data relating to a particular aspect of the present disclosure. In an embodiment, the data store illustrated includes mechanisms for storing production data and user information, which are used to serve content for the production side. The data store also is shown to include a mechanism for storing log data, which is used, in an embodiment, for reporting, computing resource management, analysis or other such purposes. In an embodiment, other aspects such as page image information and access rights information (e.g., access control policies or other encodings of permissions) are stored in the data store in any of the above listed mechanisms as appropriate or in additional mechanisms in the data store.

The data store, in an embodiment, is operable, through logic associated therewith, to receive instructions from the application server and obtain, update or otherwise process data in response thereto and the application server provides static, dynamic, or a combination of static and dynamic data in response to the received instructions. In an embodiment, dynamic data, such as data used in web logs (blogs), shopping applications, news services, and other such applications are generated by server-side structured languages as described herein or are provided by a content management system ("CMS") operating on, or under the control of, the application server. In an embodiment, a user (or generally, any suitable consumer), through a device operated by the user, submits a search request for a certain type of item. In this example, the data store accesses the user information to verify the identity of the user, accesses the catalog detail information to obtain information about items of that type, and returns the information to the user, such as in a results listing on a web page that the user views via a browser on the user device. Continuing with example, information for a particular item of interest is viewed in a dedicated page or window of the browser. It should be noted, however, that embodiments of the present disclosure are not necessarily limited to the context of web pages, but are more generally applicable to processing requests in general, where the requests are not necessarily requests for content. Example requests include requests to manage and/or interact with computing resources hosted by the system and/or another system, such as for launching, terminating, deleting, modifying, reading, and/or otherwise accessing such computing resources.

In an embodiment, each server typically includes an operating system that provides executable program instructions for the general administration and operation of that server and includes a computer-readable storage medium (e.g., a hard disk, random access memory, read only memory, etc.) storing instructions that, if executed (i.e., as a result of being executed) by a processor of the server, cause or otherwise allow the server to perform its intended functions.

As part of a communications protocol, the computing entity 202 may execute a plurality of executable instructions to provide data to another computing entity such as a client computer system. For example, the computing entity 202 may host a virtualized or remote computing environment (e.g., virtual desktop or remote desktop) which can be controlled remotely by the client computer system. Graphical state may be transmitted from the computing entity 202 to the client to allow the client to reproduce or represent the graphical state of the computing entity 202.

In an embodiment, a non-transitory computer-readable storage medium comprises executable instructions that, as a result of being executed by one or more processors of the computing entity, cause the computing entity to collects 204 data that corresponds to information presentable to an entity capable of interpreting continuity. Various types of data such as graphical and/or audio data may exhibit properties of continuity. For example, the graphical state of a computer desktop at a discrete point in time or over a duration of time may be a set of data that is collected. The entity capable of interpreting continuity may be any suitable entity that can interpret continuity. For example, a human user or other suitable consumer of a client computing device that controls the computing entity 202 as part of a remote desktop environment may be the aforementioned entity. A human user may be able to visually interpret graphical data and be able to interpret continuity of data. Continuity may refer to mathematical continuity wherein locally, certain data may be predictive of other data. Interpretation of continuous data may allow an entity to predict data which is missing, damaged, incorrect, etc.

The data may be collected in any suitable manner. For example, successive screenshots of a desktop environment may be sampled at a fixed rate or a variable rate. The variable rate of capture may be determined based on a frame rate at which graphical data is being rendered. For example, the variable rate of capture may have a frequency that is less than or equal to the rate at which graphical data is being rendered and/or drawn to an output device such as a monitor. As a second example, video data may be captured in segments (e.g., 100 milliseconds at a time, 30 hertz) and the segments may be separately processed. As an example, a checkerboard pattern may be displayed on a virtual desktop or a portion thereof. In some embodiments, a set of data is collected programmatically by collecting the data from lower level components such as the operating system. In an embodiment, data for various graphical components that are displayed are collected from the operating system, graphics devices, and more. For example, the set of data may be collected from a driver, software, firmware, etc., that manages the state of a pointing device such as the location and clicked state of a mouse cursor.

As a next step, the system may use the collected data to detect 206 regions of continuity and subsample based on the regions. In an embodiment, a set of data is collected and the set of data is processed to determine two or more subsets, each subset being a region of continuity. Various routines, algorithms, methods, etc. may be utilized to identify the subsets. For example, subsets may be determined based on visual information, what different parts of the graphical data represent, and more. In an embodiment, different portions of a computer screen correspond to different subsets. For example, various attributes of a pointing device (e.g., mouse pointer location, icon display, movement, pressed/unpressed state) may exhibit mathematical continuity and be subsampled as a subset of a set of data representing the entire desktop state. As a second example, a textbox (e.g., within a browser window, software application, command line interface, etc.) may exhibit properties of continuity and be identified as a region of continuity that is subsampled.

Continuing with the checkerboard example, the white squares of the checkerboard may be detected as a region of continuity (e.g., mathematical continuity indicating that the shape and color of one square can be correlated to the shape and color of other squares on the checkerboard). Conversely, the black squares of the checkerboard (not show in FIG. 2) may be detected as a different region of continuity. Continuity may be determined by calculating a correlation coefficient between one portion of a candidate subset with the other portions of the candidate subset. In an embodiment, if the correlation coefficient exceeds a predetermined threshold, a candidate subset is accepted. In some embodiments, the threshold has a variable value that is determined based on the size of the subset. The threshold value may be inversely correlated with the subset size. In other words, as the size of the subset increases (e.g., as a proportion of the total data set size) the threshold value decreases. This correlation may be implemented as a technique to generate fewer subsets, thereby reducing the amount of overhead that is generated as header information or compression metadata.

When data is transmitted across a medium (e.g., over fiber or copper wires, wirelessly as an electromagnetic wave) the signal encoding the data may be subjected to various types of loss. For example, different types of stochastic loss may include random loss such as spectral interference, multipath interference/loss, ionospheric interference/loss, and/or variations thereof. As a second example, a malicious party may subject a network to a denial-of-service (DOS) or distributed denial-of-service (DDOS) that renders a network or a portion of the network unable to transmit data from a source to a destination. Thus, data that is transmitted from a source computing entity to a destination computing entity may fail to be received or may be damaged during transmission such that some or all data of the transmission is altered. Data protection techniques may be utilized to repair data that is damaged and/or lost during transmission.

A denial-of-service attack may refer to an attack where a malicious party attempts to prevent a computer system from operating normally by flooding the computer system with requests beyond the system's capacity, either reducing responsiveness of the system or causing the system to stop responding to legitimate requests entirely. A distributed denial-of-service attack may refer to a denial-of-service attack performed by multiple devices where the attack by the multiple devices may be coordinated by one or more parties.

As discussed above, for example, regions of continuity may be detected and subsamples of a data set may be identified. In an embodiment, the computing entity 202 collects a set of data and determines a plurality of subsets of the data. The subsets may be non-overlapping subsets. A subset may be an independently parsable unit. For example, a first subset may include cursor data for the movement and state of a cursor of a remote desktop and a second subset may include graphical data for windows and icons of the remote desktop. A recipient computer system may receive the first subset and begin parsing and rendering the movement and state changes of a cursor (e.g., clicked or unclicked, changes in the cursor iconography) even without having received the second subset. In such an example, the recipient computer system may display older (e.g., "stale") graphical data which will be updated when the second subset of data is subsequently received. In some cases, the second subset may be lost during transmission across a lossy medium, but the first subset can nevertheless still be parsed because it is generated in a format that provides assurances of local sequential completeness. Local sequential completeness of data (e.g., a UDP datagram) refers to the ability for a recipient computer to parse the data irrespective of whether other data (e.g., other parts of a graphical user interface) are received, in accordance with an embodiment.

Subsamples or subsets of data may be compressed 208 as independently parasble units as described above. A subset can be compressed using any suitable compression algorithm or technique known to one of ordinary skill in the art. Data (e.g., a subset) may be compressed, thereby generating compressed data (e.g., a compressed subset). When data is compressed, in an embodiment, the result is a compressed payload and header and/or metadata that is usable to determine how to decompress the compressed payload to generate the original data. In some embodiments, subsets of a set of data are selected based on continuity which can result in being able to have better compression results as compared to compressing the entire data set. For example, instead of compressing a data set M that includes the entire checkerboard matter thereby generating a compressed data set C and a header H, a first subset $M_1$ of the black squares may be compressed to generate a first compressed subset $C_1$ and first header $H_1$ and a second subset $M_2$ of the white squares may be compressed to generate a second compressed subset $C_2$ and a second header $H_2$ wherein the size of $\{C_1, H_1, C_2, H_2\}$ is smaller than the size of $\{C, H\}$. This may be due to compression algorithm being able to achieve greater compression ratios on each subset that offsets the additional size required for two headers/compression metadata as opposed to one when the entire data set is compressed together.

Compressed units may be transmitted over a network, such as the Internet, to a recipient computing entity that is configured with executable code that, if executed, parses received compressed units to decompress the compressed unit and render the units on a graphical output device. The executable code may be implemented in the form of a plugin, applet, application, driver, and more. In an embodiment, the network includes any appropriate network, including an intranet, the Internet, a cellular network, a local area network, a satellite network or any other such network and/or combination thereof and components used for such a system depend at least in part upon the type of network and/or system selected. Many protocols and components for communicating via such a network are well known and will not be discussed herein in detail. In an embodiment, communication over the network is enabled by wired and/or wireless connections and combinations thereof. In an embodiment, the network includes the Internet and/or other publicly-addressable communications network, as the system includes a web server for receiving requests and serving content in response thereto, although for other networks an alternative device serving a similar purpose could be used as would be apparent to one of ordinary skill in the art.

Figure 3:
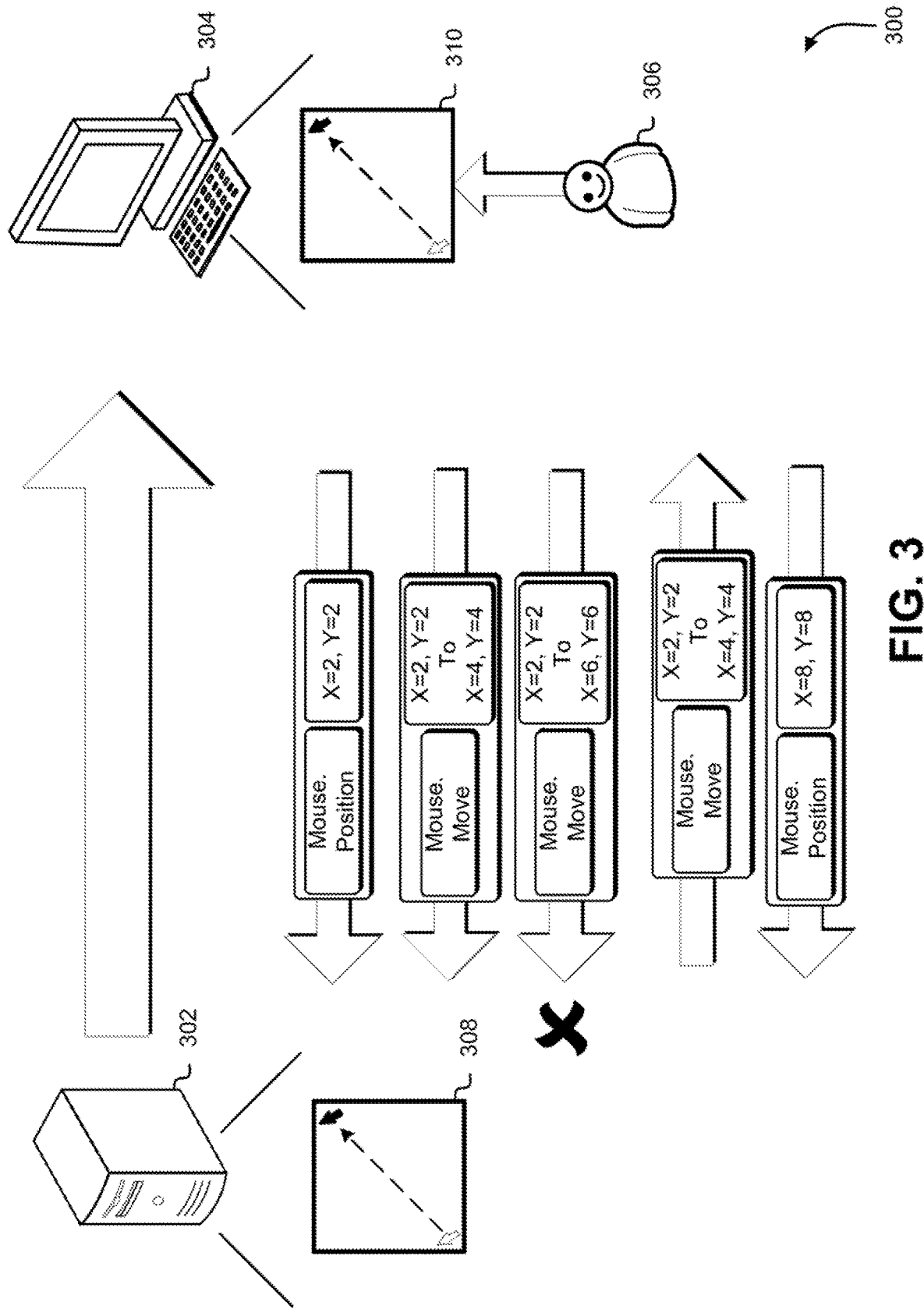
FIG. 3 illustrates a computing environment in which a continuity-based data protection technique is applied to mouse cursor data, in accordance with at least one embodiment.

FIG. 3 illustrates a computing environment 300 in which a continuity-based data protection technique is applied to mouse cursor data. The computing environment 300 illustrates a computing entity performing a continuity-based data protection routine. The routine may be performed by any suitable computing entity, such as those described in connection with FIGS. 1-2 and 4-9. The process described in connection with FIG. 8 may be implemented at least in part by the computing environment 300 illustrated in FIG. 3.

In an embodiment, a communications protocol is utilized by a first computing entity 302 to receive and process a set of data transmitted by a second computing entity 304 using a continuity-based data protection technique. Data may be collected, processed, subsampled, compressed, and transmitted by the second computing entity 304 to the first computing entity 302. The second computing entity 304 may be under the control of a user 306 that detects commands or operations performed by the user 306 and generate a representation of the original data that is interpretable by the user 306 of the second computing entity 304. A remote desktop application can be implemented in the computing environment 300 in accordance with at least one embodiment. The user 306, in an embodiment, is a consumer of continuity-based data.

The first computing entity 302 may be any suitable computing entity such as those described elsewhere in this disclosure. The first computing entity 302 may be a computer server of a computing resource service provider that provides remote desktop or virtual desktop computing services to clients of the computing resource service provider. The second computing entity 304 may be a client of the computing resource service provider, implemented as or as part of the first computing entity 302. The first computing entity 302 may be a personal computer of a multimedia source such as a multimedia streaming source in which video or multimedia of the personal computer or a portion (e.g., certain portions of a graphical user interface such as a window of the personal computer corresponding to a video game, video captured from a webcam or other video capture device) thereof is capture.

The second computing entity 304 may be connected to the first computing entity 302 over a lossy network in which there is a non-zero probability that data transmitted over the network may be lost. The second computing entity 304 may be any suitable computing entity such as a personal computer. The second computing entity 304 may be a client of a computing resource service provider, a client of a multimedia streaming service, and more. The second computing entity 304 may have or be connected to a graphical output device such as a monitor or projector. A user 306 may refer to an entity such as a human user that is capable of interpreting continuity.

The second computing entity may collect and process source data 310 and the first computing entity may receive data different from the source data that is a representation 308 of the source data which is interpretable by the user 306. Source data 310 is collected by the second computing entity 304 in accordance with an embodiment. The source data 310 may be referred to as original data or a collected data set throughout the disclosure. The source data 310 may be graphical data corresponding to a graphical user interface of the second computing entity 304 or another computing entity interacting with the second computing entity 304. The source data 310 illustrated in FIG. 3, in an embodiment, corresponds to graphical data that includes the movement of a mouse cursor across a graphical user interface such as a desktop. While a mouse cursor is discussed in connection with FIG. 3, these techniques can be applied to other graphical contexts. The source data 310 may be collected and subsampled to disaggregate the mouse cursor data to be a subset of the original data. The subset may include various data such as the position of the mouse cursor, the movement of the mouse cursor across the screen, whether an icon or object is being dragged across the screen, and more. The subset may be encoded according to a protocol in which each data message has properties of local sequential completeness. The data message may be a UDP datagram transmitted over communications channel that does not provide assurances of total sequential completeness.

The source data 310 is parsed and mouse data is isolated, processed, compressed, and transmitted. The processed subset of mouse data, in an embodiment, has local sequential completeness in the sense that one datagram of mouse data is not dependent on another datagram of mouse data. Consider the example shown in FIG. 3—the original data indicates a mouse moves diagonally from coordinates (2,2)

to (8,8). A first datagram message may encode the initial mouse position is at (2,2). Generally speaking, the datagrams discussed herein may be compressed using any suitable compression algorithm. The first datagram may be transmitted from the second computing entity 304 to the first computing entity 302 via a communications channel that does not provide assurances of acknowledgement and/or receipt of the datagram. Continuing with the example, a second datagram may indicate that the mouse cursor moved from (2,2) to (4,4) and encodes information sufficient for the second computing entity to parse and render the movement of the mouse cursor from (2,2) to (4,4) even if the first datagram is not received by the second computing entity or is received after the second datagram. For example, in the case that the second datagram is received before the first datagram, the first computing entity 302 is still able to immediately parse, process, and render the data encoded in the second datagram indicating the mouse movement from (2,2) to (4,4).

FIG. 3 further illustrates aspects of the continuity-based data protection technique in the case where data is lost. Consider the third datagram, which may exhibit local sequential completeness in the sense that the third datagram—which indicates mouse movement from (2,2) to (6,6)—can be processed if it is received by a recipient computer system prior to the first and second datagrams. However, the third datagram is not received by the second computing entity in the example illustrated in FIG. 3.

A reflection protocol, in an embodiment, is utilized by the first computing entity to provide an indication to the second computing entity of the state that has been processed. In this example, the first and second datagrams are received and processed but the third datagram is not received. As a result, the first computing entity is able to provide an acknowledgement that it has successfully received information that indicates that the mouse cursor has moved from (2,2) to (4,4). A fourth datagram, in an embodiment, encodes updates to the position of the mouse cursor as there is an indication that the recipient has processed the movement of the mouse cursor from (2,2) to (4,4). Accordingly, encoding just the updated mouse position is sufficient for the first computing entity to move the mouse to (8,8). Accordingly, a representation 308 of the source data is produced based on the first datagram, the second datagram, and the fourth datagram.

It is noted that while an arrow is illustrated pointing to the first computing entity 302 from the second computing entity 304 that it does not necessarily mean that there is no communications flowing to the second computing entity from the first computing entity, such as in embodiment where a reflection protocol calls for return or acknowledgement messages to be sent rather, it means that there is a conveyance of information to the first computing entity from the second computing entity—namely, in this example, that mouse cursor is moving from (2,2) to (8,8).

Figure 4:
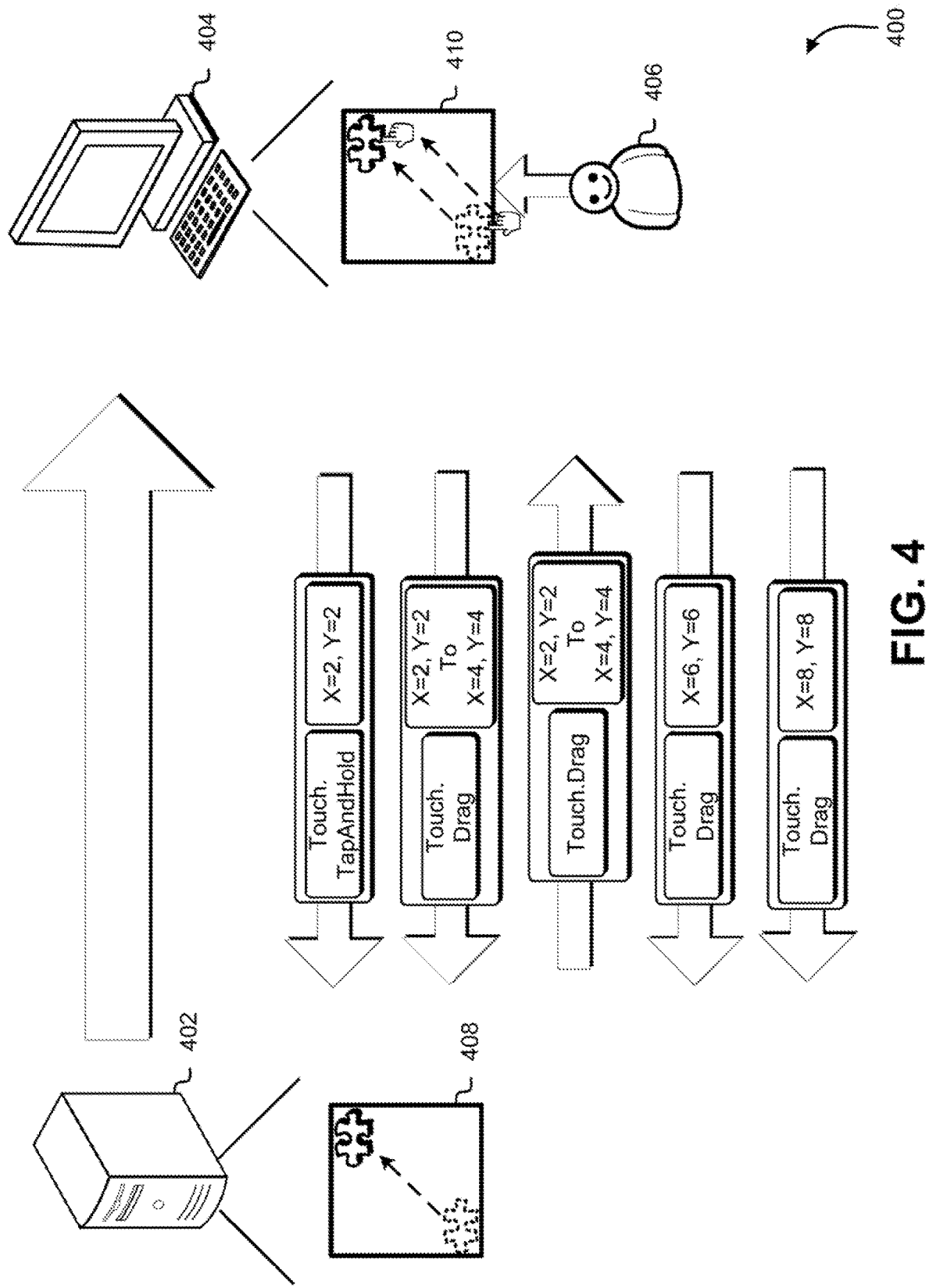
FIG. 4 illustrates a computing environment in which a continuity-based data protection technique is applied to touch gestures, in accordance with at least one embodiment.

FIG. 4 illustrates a computing environment 400 in which a continuity-based data protection technique is applied to touch gestures. The computing environment 400 illustrates a computing entity performing a continuity-based data protection routine. The routine may be performed by any suitable computing entity, such as those described in connection with FIGS. 1-3 and 5-9. The process described in connection with FIG. 8 may be implemented at least in part by the computing environment 400 illustrated in FIG. 4.

A first computing entity 402 may be any suitable computing entity such as a computer server hosting a virtual or remote desktop environment. A second computing entity 404 may be any suitable computing entity such as a laptop or electronic device. The second computing entity 404 may be in accordance with other computing entities described in this disclosure and may have or have support for an input device such as a touch screen that allows a user such as a human to perform gesture-based commands such as tapping, swiping, pinching, and more. The touchscreen may support a touch-and-drag gesture in which a command is registered when a user presses down on the touchpad with one or more fingers and drags the one or more fingers on the screen and releases after moving the finger around the screen. The second computing entity 404 may be accessible to the user 406 in the manner described in connection with FIG. 3.

In an embodiment, a first touch command is registered indicating that a touch gesture was detected. As an example, the touch gesture may correspond to the user pressing down at a first location (2,2) and dragging a puzzle icon from (2,2) to (8,8). According to a continuity-based protocol, various datagrams may be transmitted to convey this information to a remote client. While datagrams are described in this example, other types of electronic messages and communications are also contemplated. Returning to the example, when the user first presses down on the screen and registers a press, a first datagram may indicate that there was a tap and hold on the screen at (2,2). This may be in contrast to a tap (and release) which may be a different gesture command. As the puzzle piece is dragged across the screen, a second datagram may be transmitted that conveys sufficient information for the first computing entity 402 to parse the command locally without needing additional information. The datagrams may, accordingly, have properties of local sequential completeness. Note, for example, if the second datagram is received prior to the first datagram (or if the first datagram is lost) the first computing entity 402 can nonetheless still proceed with parsing the second datagram and rendering the movement of the puzzle piece.

An acknowledgement may be sent by the first computing entity upon receiving a datagram such as the second datagram. The reflection message may include information indicating what state the first computing entity is in or what data it has received and/or parsed. In FIG. 4, the reflection message indicates that the second datagram was received. Upon receiving the acknowledgement over the reflection protocol, subsequent datagrams transmitted may simply include an indication that a touch gesture is being dragged across the screen to (6,6) in a third datagram and to (8,8) in a fourth datagram. Since the second computing entity 404 has already confirmed that the first computing entity 402 has received data indicating that the tap-and-hold from (2,2) to (4,4) was received, subsequent datagrams may simply include updated positions and not include addition information such as where the dragging originally started from. In some embodiments, the touch gesture is performed on the second computing entity 404 which is a thin remote client and the touch gestures are transmitted across the network to a remote or virtual computing environment where the gesture is processed, and the results of the gestures are conveyed back to the second computing entity 404, such as in the case of a remote desktop environment.

Figure 5:
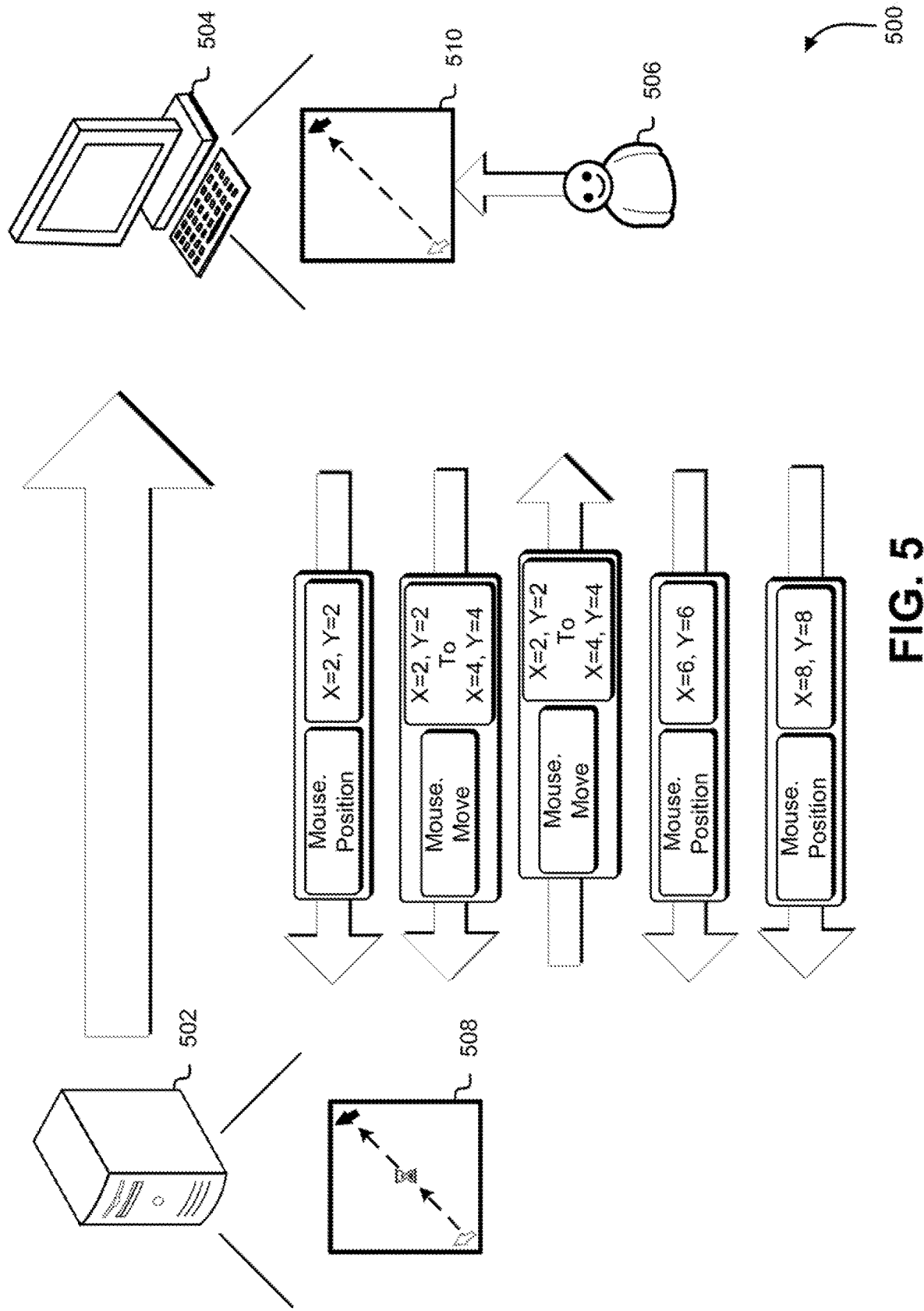
FIG. 5 illustrates a computing environment in which a continuity-based data protection technique is applied to optimizing continuity-based data protection scheme, in accordance with at least one embodiment.

FIG. 5 illustrates a computing environment 500 in which a continuity-based data protection technique is applied to optimizing continuity-based data protection scheme. The optimization may refer to improving the run-time of the routine (e.g., making it run faster) and/or bandwidth usage. The computing environment 500 illustrates a computing entity performing a continuity-based data protection routine. The routine may be performed by any suitable computing entity, such as those described in connection with FIGS. 1-4 and 6-9. The process described in connection with FIG. 8 may be implemented at least in part by the computing environment 500 illustrated in FIG. 5.

In an embodiment, data is gathered on the second computing entity 504 regarding the state of data that is presentable to an entity that is able to interpret continuity. The second computing entity 504 may host a computing environment that is controllable by a user such as a remote user or a local user. A remote user or consumer may be the user 506 illustrated in FIG. 5 that submits commands via the second computing entity 504 over a network to control the first computing entity 502. The user may be a local user that interacts directly with the first computing entity 502, for example by using an input device communicatively coupled with the first computing entity 502.

Source data 510 illustrate in FIG. 5 includes the movement of a mouse cursor across a screen. The movement patterns described are merely illustrative in nature and not limitative as to different patterns and implementations contemplated in the scope of this disclosure. While the mouse cursor moves across the screen, state information of the mouse may change, such as the coordinates of the mouse on the screen, as described above. Additional state information may change, such as the shape of the cursor. For example, when the mouse cursor hovers over a text filed, the cursor graphic may change. In some cases, when a file is opened the system may display an hourglass icon to indicate that the command to open the file is being processed. As part of a continuity-based data protestation protocol, state information may be omitted from the protocol. For example, as part of generating datagrams from the source data set, the data related to the icon changing to an hourglass icon may be stripped or omitted whereas other state data such as the mouse position and whether it is in a clicked or unclicked state may be retained and transmitted across the network. As a result, network connections may be improved and parsing performance of the second computing entity receiving the datagrams may be improved.

Figure 6:
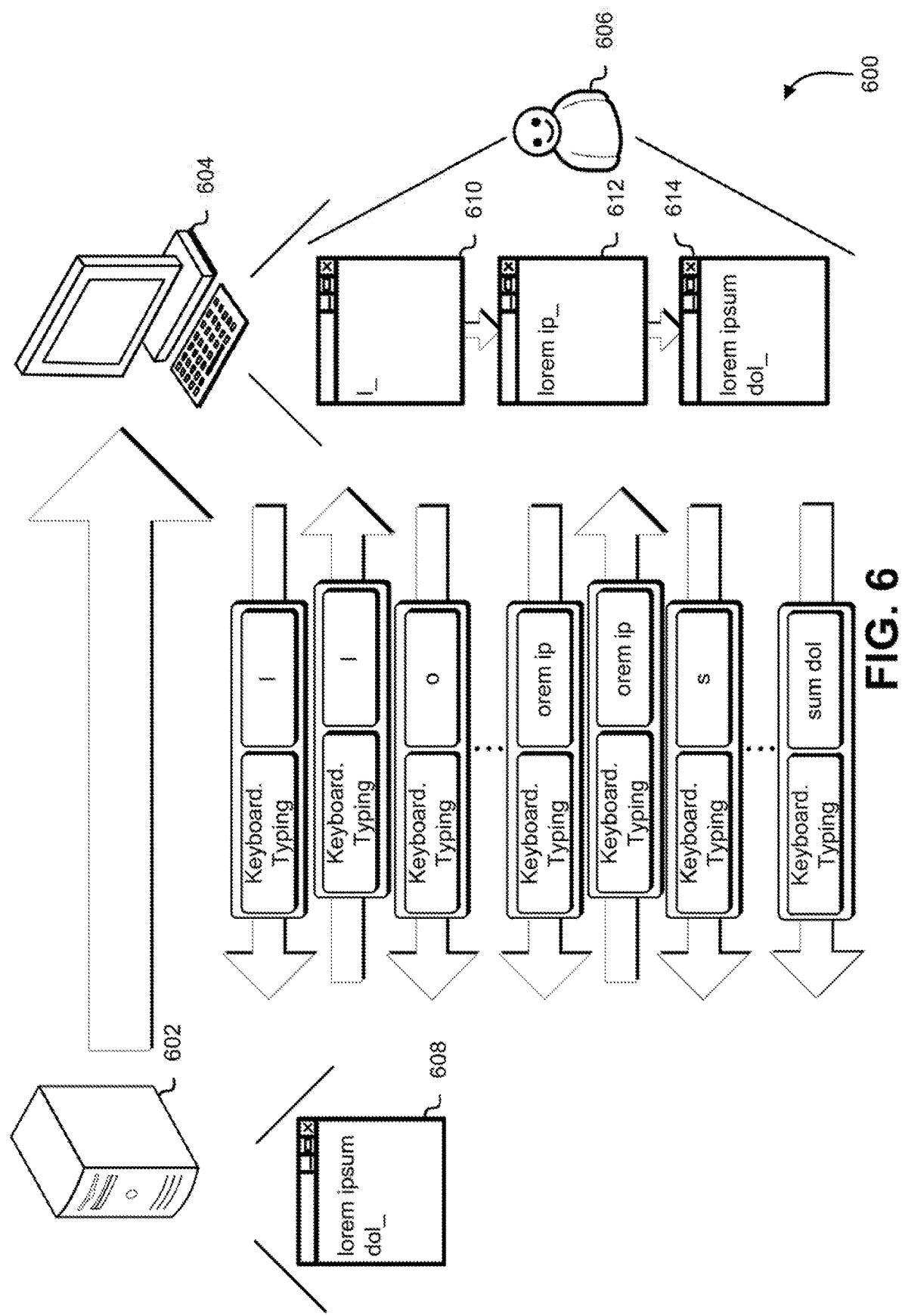
FIG. 6 illustrates a computing environment in which a continuity-based data protection technique is applied to text-based continuity-based data protection schemes, in accordance with at least one embodiment.

FIG. 6 illustrates a computing environment 600 in which a continuity-based data protection technique is applied to text-based continuity-based data protection schemes. The optimization may refer to improving the run-time of the routine (e.g., making it run faster) and/or bandwidth usage. The computing environment 600 illustrates a computing entity performing a continuity-based data protection routine. The routine may be performed by any suitable computing entity, such as those described in connection with FIGS. 1-5 and 7-9. The process described in connection with FIG. 8 may be implemented at least in part by the computing environment 600 illustrated in FIG. 6. The first computing entity 602, second computing entity 604, and user 606 may be in accordance with those described elsewhere in this disclosure.

In some embodiments, the user 606 is a non-limiting example of a consumer at a remote terminal and types text that is transmitted across a network to a terminal on a server that hosts software applications. As the user types the text, the user experience can be improved by providing consistent feedback that the user's keystrokes were registered on the server. As an example, keystrokes of the user 606 may be transmitted across a network such as the Internet to a computing resource service provider hosting a virtual machine with a command line interface where the keystrokes are propagated.

As text (e.g., registered from keystrokes or otherwise rendered on a screen) appears on the screen, it may be captured as source data 610, 612, and 614 which is collected and transmitted according to a protocol to a remote server which receives and processes the text 608. In some cases, as the text is being typed and rendered, it is being transmitted to a remote client. For example, consider the user experience when the text "lorem ipsum dolor . . . " is typed at a rate of one hundred words a minute. A poor (e.g., slow, choppy, lagged) user experience would involve rendering the entire text at once after a delay of several hundred or thousands of milliseconds. Characters may be collected and transmitted in small time intervals, such as every 100 milliseconds or the threshold time for the user to react to a visual stimulus. As the text data is collected it is transmitted in subsets. A first subset may include text typed in first 100 milliseconds (e.g., "1") and then transmitted as part of a first datagram according to a protocol and is received by the second computing entity 602 where a remote computing environment processes the typed text (e.g., entering it to the corresponding command line or software running on the remote server) and sending an acknowledgement to the first computing entity 604 that the text was registered. After another 100 milliseconds, the system may collect additional text (e.g., "o") as the next datagram. After a further 100 milliseconds, the system may re-transmit the unconfirmed/unacknowledged text in additional to more text that was typed as the third datagram. As no acknowledge has been received yet, "orem ip"—which includes the "o" from the unacknowledged or yet-to-be-acknowledged second datagram—is transmitted in the third datagram. The third datagram has local sequential completeness such that if the second datagram is not received or if there is no indication that the second datagram is received, that the third datagram nevertheless can be parsed and rendered. In an embodiment, the second computing entity 604 receives an acknowledgement that the third datagram is received and a fourth datagram includes subsequent text without needing to retransmit text that was acknowledged to have been received.

Figure 7:
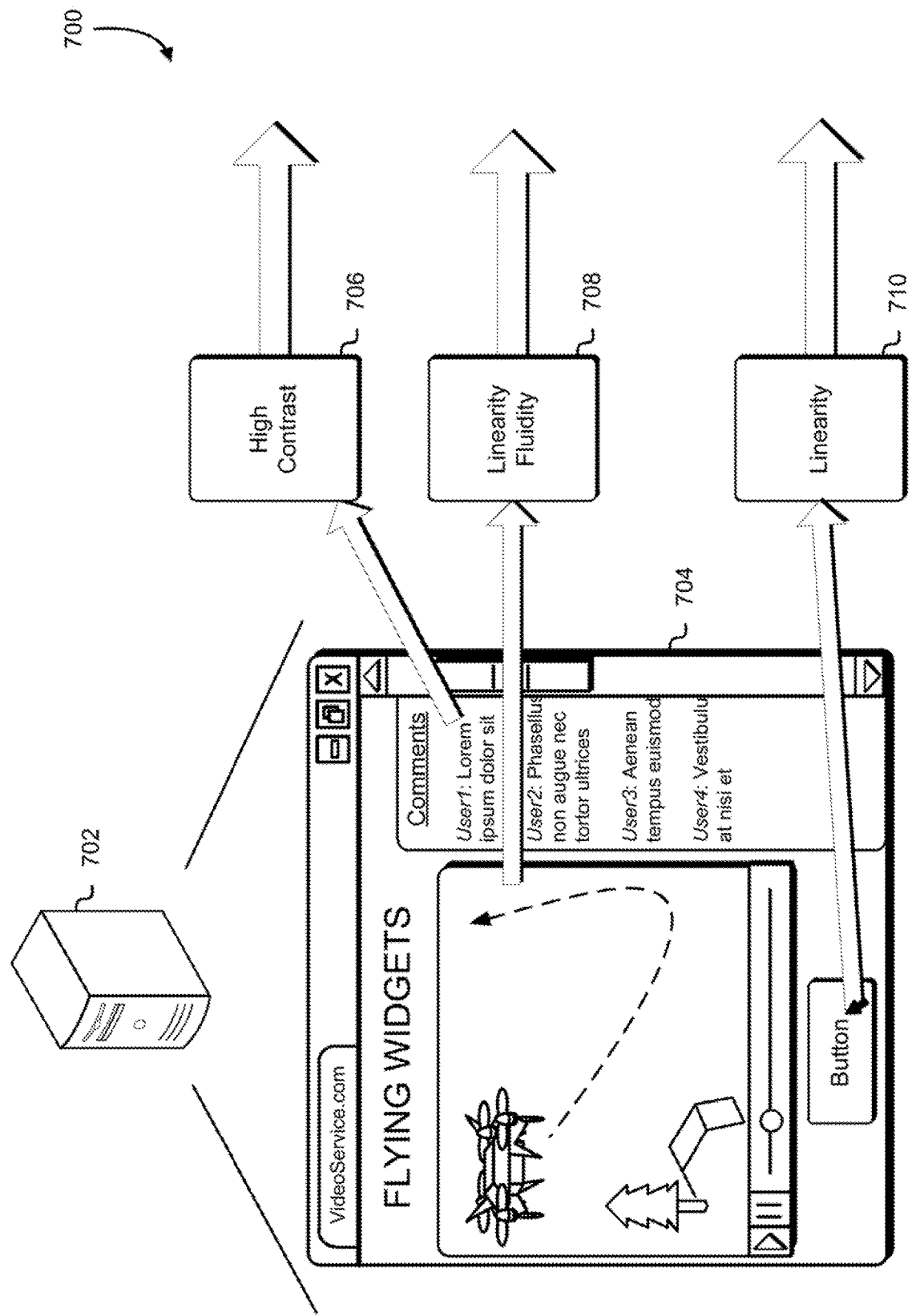
FIG. 7 illustrates a computing environment in which a virtual desktop infrastructure can be implemented to generate representations of a virtual desktop environment, in accordance with at least one embodiment.

FIG. 7 illustrates a computing environment 700 in which a virtual desktop infrastructure can be implemented to generate representations of a virtual desktop environment. Techniques described herein may be applied to remote desktop environments, video streaming environments, and other types of computing environments.

The computing environment includes, in an embodiment, a computing entity 702 that supports a graphical user interface for running software applications such as a web browser 704. In an embodiment, the computing entity comprises an application server. In an embodiment, the application server provides access control services in cooperation with the data store and generates content including, but not limited to, text, graphics, audio, video and/or other content that is provided to a user associated with the client device by the web server in the form of HyperText Markup Language ("HTML"), Extensible Markup Language ("XML"), JavaScript, Cascading Style Sheets ("CSS"), JavaScript Object Notation (JSON), and/or another appropriate client-side or other structured language. Content transferred to a client device, in an embodiment, is processed by the client device to provide the content in one or more forms including, but not limited to, forms that are perceptible to the user audibly, visually and/or through other senses. The handling of all requests and responses, as well as the delivery of content between the client device and the application server, in an embodiment, is handled by the web server using PHP: Hypertext Preprocessor ("PHP"), Python, Ruby, Perl, Java, HTML, XML, JSON, and/or another appropriate server-side structured language in this example. In an embodiment, operations described herein as being performed by a single device are performed collectively by multiple devices that form a distributed and/or virtual system.

In an embodiment, the web browser 704 occupies all or a portion of a GUI state that is to be transmitted from the computing entity 702 to another computing entity over a network. For example, the GUI may be parsed, analyzed, and subsampled to generate subsets of the GUI that are transmitted at different properties, such as different priorities. A higher priority may correspond to the subset being processed quicker. Priority can be manifested in any suitable manner. For example, a higher priority may correspond to a thread processing a subsample to receive a higher thread priority than another thread processing a lower priority region that is competing for computing resources. The computing resource may or may not support parallel thread execution. As a second example, a networking device such as a network interface card (NIC) that buffers outgoing data packets using one or more queues may prioritize higher priority regions. In an embodiment, the NIC has multiple queues corresponding to data packets of different priorities and sends data packets in higher priority queues and only sends data packets in lower priority queues when the higher priority queues are empty. In an embodiment, the NIC has a single queue that is generally implemented in a first-in-first-out (FIFO) manner but allows for higher priority packets to be inserted to the front or middle of the queue so as to prioritize it over lower priority data packets which are enqueued to the back of the queue. Techniques described herein are merely illustrative and not to be considered limitative to the scope of the disclosure. For example, while queues have been discussed, any suitable data structure such as a vector, list, array, stack, map, linked list, etc. may be used in place or in addition to a queue. Additionally, the prioritization may include additional factors, such as the pendency of lower-priority data packets. For example, if a low priority data packet has been pending transmission for over a threshold time, then it may be transmitted rather than a higher priority data packet.

The illustrative example of a web browser 704 shown in FIG. 7 includes various regions which can be categorized and prioritized. For example, the web browser may include various regions that include one or more of the following: a chat window where text and/or graphics can be received and sent; a video or multimedia; a mouse cursor or other type of interface which a user can interact with the web browser. Different regions of the screen may be categorized and prioritized.

For example, a first region prioritization metadata 706 may correspond to text that is being rendered on the screen. The text may be identified as being static text, such as text on a webpage of a Wikipedia article, published academic paper, or other text data that is largely static and not changing in real-time. Static text may be characterized as being high priority and high contrast, as the delivery of text in a high contrast form is important (e.g., blurred or low-contrast/low-resolution text may not be readable to a consumer of the text) and high priority based on the static nature of the text—which may be in contrast with scrolling text which is given a lower priority as dropping or electing not to render scrolling text may be less detrimental, especially if a user quickly scrolls past the text without an intent to read it (such as while navigating a list on a file explorer or we browser).

The second region prioritization metadata 708 may correspond to a video or multimedia that is being played on the screen. For example, FIG. 7 illustrates a recorded video that is being played back of an aerial vehicle (e.g., drone) flying across the sky over a tree and bridge. In some embodiments, the video is a recorded video in which buffering is allowable. In some cases, video such as a live broadcast may be under real-time constraints where buffering is inappropriate. However, in some cases, such as where a recorded video is being played back at a later point in time, buffering may be acceptable. In such cases, the video may have a lower priority than other data being rendered on the screen. This may be because of the relative impact of delays in different data elements being rendered. For example, if a video being played back is buffered an additional 100 milliseconds to accommodate prioritizing a real-time conversation (e.g., via a voice-over-IP call) a better user experience is achieved as the additional buffering of on-demand video is less detrimental than delays or loss of real-time data. Video data may be prioritized for linearity and fidelity. Fluidity may be less important for video as the occasional loss of a frame may have minimal or no impact on generating an acceptable representative state for a user on a remote client. Techniques such as linear interpolation may be utilized to accommodate such losses.

The third region prioritization metadata 710 may correspond to an interactive element of the screen such as the region of the screen which a mouse cursor that a user at the remote terminal controls by submitting commands to a server over a network. The interactive element may be prioritized with linearity and high priority, whereas fidelity (e.g., the sharpness of the cursor or even the relative shape) is not of the upmost importance. The interactive elements may receive a heighted priority as the responsiveness of such elements are important for providing feedback to a remote user that the virtual computing environment is connected and that the user's commands are being registered.

In some embodiments, prioritizing different elements is based on a set of heuristics or factors. For example, changes in high contrast areas and text may be more important than generating high fidelity images. Reading elements such as text may have higher priority and picture perfect render. Interactive elements may be prioritized with linearity and fluidity. Video may be prioritized for linearity and fidelity—fluidity may not matter as much for video as an occasional dropped frame may still result in an acceptable user experience. Higher priority may be given to regions and elements near an interactive element, regions where a user is actively inspecting, and more. A camera may be used to track a user's eye movements to determine regions where the user is actively viewing.

In some cases, multimedia such as a video from a video streaming service is not expected to be live. A virtual desktop infrastructure may detect that areas are not real-time response and allow rendering of such data elements to be delayed or buffered in lieu of providing other content that is more urgent. Accordingly, the latency for certain data can be extended to accommodate processing and/or transmission of other data having a higher priority. By enlarging the latency and freeing up computing resources, the system may be able to repair lost data prior to the rendering horizon. That said, with additional buffering, longer chains of data dependency may be produced, which may be weighed as a factor for adjusting the relative priority of different data.

In some embodiments, qualifying, coalescing, or unifying data regions of common characteristics is aided by the user interactively. In some embodiments, a virtual computing environment such as a virtual desktop is hosted on an application server and a client computer system is configured with a client library or plugin for interacting with the virtual computing environment. The plugin may detect that there is a video region of the screen and generate an overlay and graphical prompt asking the user whether the video is live or not. Whether the video is live or not may indicate whether buffering and prioritization techniques are applicable.

In an embodiment, metrics and properties are evaluated to detect regions that can be actioned on. One such example is for a webpage, where a virtual desktop infrastructure can detect that navigation was occurring (e.g., due a mouse click causing navigation). When the user interacts with the screen and there are transient rectangular and highly complex images that come on to the screen, those regions can be isolated and assessed to determine how much computation cost would be needed to convey those images in total. For example, rendering and re-rendering of simple elements such as scroll bars, boxes, and text may be relatively low as compared to images. The computational cost needed and the computing resources available can be used to schedule how different regions are processed. For example, the image regions may be de-prioritized and processed after the system is in a steady state—for example, after a user has finished rapidly scrolling past a number of images in a photo album. Conversely, as the movement of the scroll bar as the user is rapidly scrolling may be rendered with linearity and fluidity.

Figure 8:
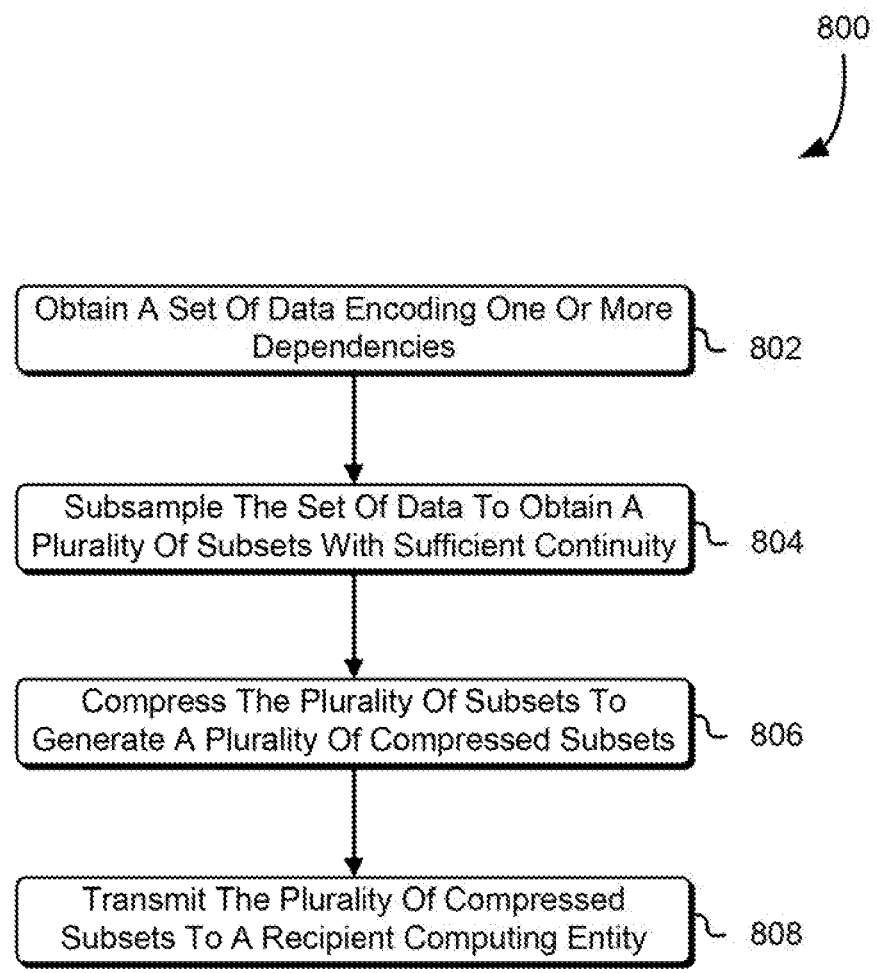
FIG. 8 shows an illustrative example of a process for continuity-based data protection, in accordance with at least one embodiment.

FIG. 8 shows an illustrative example of a process 800 for continuity-based data protection in accordance with an embodiment. Some or all of the process 800 (or any other processes described herein, or variations and/or combinations thereof) may be performed under the control of one or more computer systems configured with computer-executable instructions and may be implemented as code (e.g., computer-executable instructions, one or more computer programs, or one or more applications) executing collectively on one or more processors, by hardware, software, or combinations thereof. The code may be stored on a computer-readable storage medium, for example, in the form of a computer program comprising a plurality of computer-readable instructions executable by one or more processors. The computer-readable storage medium may be a non-transitory computer-readable medium. In some embodiments, at least some of the computer-readable instructions usable to perform the process 800 are not stored solely using transitory signals (e.g., a propagating transient electric or electromagnetic transmission). A non-transitory computer-readable medium may include non-transitory data storage circuitry (e.g., buffers, caches, and queues) within transceivers of transitory signals. The process 8 may be implemented in any suitable computing environment such as those discussed in connection with FIGS. 1-7.

A suitable system or computing entity for performing the process may obtain 802 a set of data encoding one or more dependencies. The data may correspond to a graphical representation of a computing environment hosted on the system such as graphics and/or text that is rendered or renderable on a graphical output device such as a monitor or projector. The system may obtain the data by capturing output graphics data, such as by capturing screenshots or video captures of resulting output that can be displayed via a graphical output device. The data can be obtained by querying an application programming interface (API) to obtain such data, for example, operating systems level API commands for obtaining data about certain state of the graphical representation. The graphical representation of the computing environment can be a remote desktop that is controlled by a remote client over a network such as the Internet.

The system may subsample 804 the set of data to obtain a plurality of subsets with sufficient continuity. The plurality of subsets may be obtained by detecting regions of constancy and regions of smoothness of a screen. Different regions of the screen may be subsampled to determine whether candidate regions are sufficiently continuous. In some cases, contiguous regions of a screen or image are subsampled. In some cases, non-contiguous regions of the screen are sub sampled, such as in the checkerboard example described above where a first region and second region encode interlaced graphical data (e.g., white and black squares of a checkerboard, respectively). Continuity (or the lack thereof) of a region can be determined using any suitable technique. For example, the system may calculate a correlation coefficient for the subset and determine whether that correlation coefficient has a value that exceeds a threshold value. The correlation coefficient may be a value between 0 and 1 which indicates how closely one part of a region predicts another part of the region. In an embodiment, the threshold value is a dynamic value that changes based on the size of the subsample—the value may be inversely correlated to the size of the subsample or region. For example, if the regions being subsampled are large, it indicates that there will be less compression metadata to encode (e.g., N headers) as compared to a larger number of subsamples (e.g., M>N headers). Accordingly, having less overhead would result greater tolerance in having somewhat weaker correlated regions being selected and still being able to achieve greater bandwidth savings as compared to a wholesale compression of the entire data set.

The system may compress 806 the plurality of subsets to generate a plurality of compressed subsets. The subsets may be compressed using any suitable technique such as those described in connection with FIGS. 1-6 of this disclosure. Compressing the plurality may include utilizing a compression algorithm such as those known to one of ordinary skill in the art. In some embodiments, the subset is compressed by reducing the amount of data to transmit across a network, thereby reducing bandwidth constraints on the network. This may be performed in the manner described in connection with FIG. 5. The subsets may each be compressed individually—for example, compressing subsets {A, B, C} may be performed using a compression routine C( ) to generate a plurality of compressed subsets {C(A), C(B), C(C)}. The system may further generate a forward error correction (FEC) code based on the subsets or compressed subsets (or portions thereof) and transmit the FEC code to the recipient to provide additional data protection that is orthogonal to continuity-based data protection techniques described throughout this disclosure.

The system may transmit 808 the plurality of compressed subsets to a recipient computing entity. The recipient computing entity may be a remote client of a virtual or remote desktop that is hosted on one or more servers of a computing resource service provider that is connected to the remote client via a network such as the Internet. Data may be transmitted over the network via a communications channel that does not provide for total sequential completeness (e.g., as between discrete data packets sent over the channel) and/or does not guarantee sequencing as between discrete packets that are received by the recipient. In an embodiment a user datagram protocol (UDP) communications channel is used to transmit the plurality of compressed subsets to the recipient computing entity. The communications channel utilized to transmit the plurality of compressed subsets may lack assurances of total sequential completeness such that if a first message is sent before a second message, the second message may be received before the first message. Data transmitted in such messages may have local sequential completeness such that the second (later-transmitted) message can still be parsed and rendered by an output device of the recipient computing entity regardless of whether the first (earlier-transmitted) message is received. In this manner, it can be said that the first and second messages are independently parsable. These messages may be compressed subsets. A reflection protocol may be utilized to update state information as discussed in greater detail elsewhere in this disclosure for example in connection with FIGS. 3-5.

Figure 9:
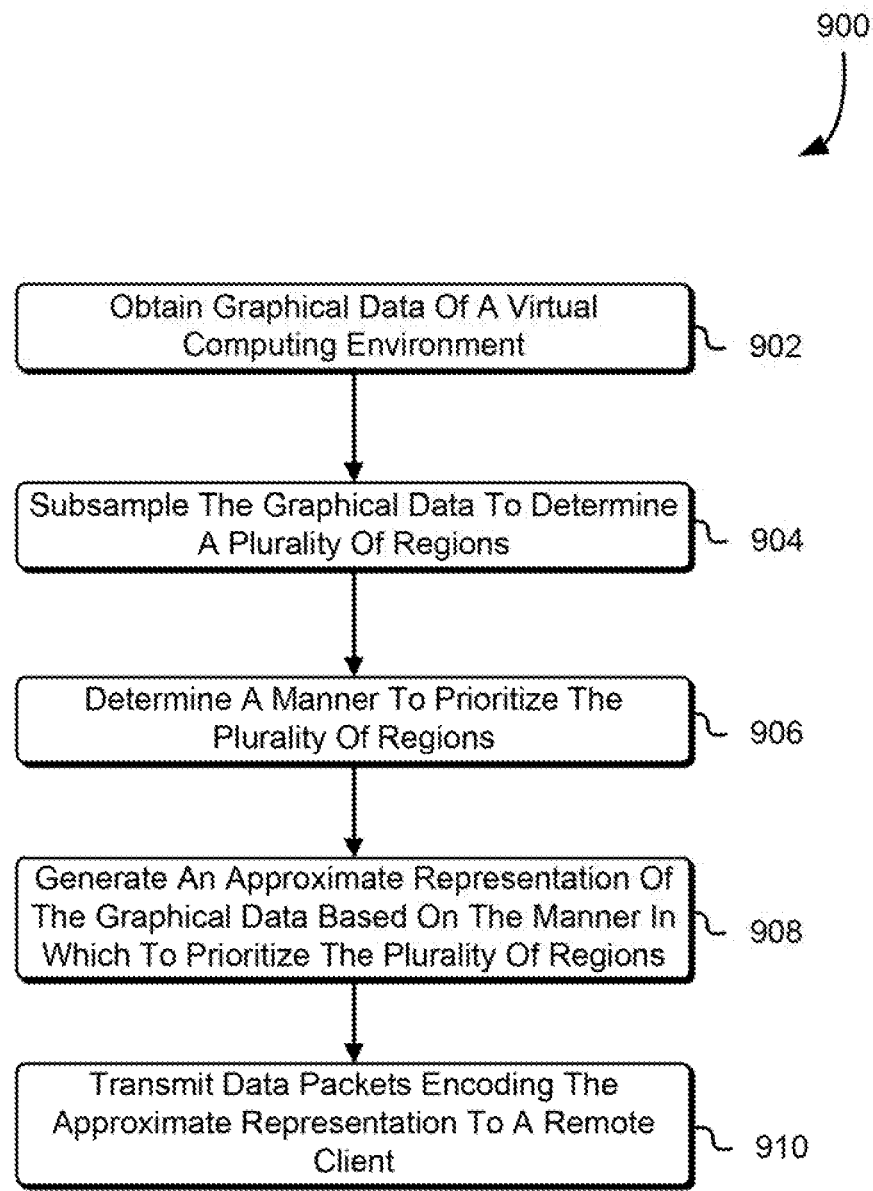
FIG. 9 shows an illustrative example of a process for generating an approximate representation for a virtual computing environment, in accordance with at least one embodiment.

FIG. 9 shows an illustrative example of a process 900 for generating an approximate representation for a virtual computing environment, in accordance with one embodiment. Some or all of the process 900 (or any other processes described herein, or variations and/or combinations thereof) may be implemented according to techniques described elsewhere in this disclosure such as those discussed in connection with FIG. 8. The process may be implemented at least in part by a server computer system.

A system performing the process may obtain 902 graphical data of a virtual computing environment, in accordance with an embodiment. The graphical data can be collected or obtained in any suitable manner. For example, successive screenshots of a desktop environment may be sampled at a fixed rate or a variable rate. The graphical data may be collected using techniques described herein above and below. The graphical data may be computer desktop and include graphical user interface elements such as text, vector graphics, images, video, and so on.

The system may subsample 904 the graphical data to determine a plurality of regions. In some embodiments, the graphical data is subsampled to determine the plurality of regions which are analyzed for various factors such as visual complexity, visual shape, time history, and user input. The system may determine 906 a manner to prioritize the plurality of regions, in an embodiment. In some embodiments, detecting a region of high contrast or text is prioritized. In some embodiments, playback of a video is de-prioritized. Regional data can be prioritized or de-prioritized based on whether it is transient. For example, in a source graphical user interface, when text and graphics such as images are rapidly scrolled over, it may be the case that the text is prioritized ahead of the transient images, and that placeholder images (e.g., a pre-rendered thumbnail) is used in place of the actual image until the system comes to a rest. In some cases, transient images that are only visible for a short duration (e.g., measured by a number of frames) is not displayed or even transmitted to the remote client, resulting in a savings in bandwidth and increase in rate of delivery for other data.

The system may generate 908 an approximate representation of the graphical data based on the manner in which to prioritize the plurality of regions. The system may determine the manner in which to prioritize the region by analyzing a region based on visual complexity, visual shape, time history, user input, and any combination thereof. The system may transmit 910 the approximate representation to a remote client. The approximate representation may be encoded as a plurality of packets that correspond to different regions of a graphical user interface hosted on a server. The data packets may be transmitted over a network using a UDP-based communications channel.

In an embodiment, the process 900 is implemented in the context of a client-server relationship in which a server computer of a computing resource service provider generate an approximate representation of a virtual desktop hosted by the service provider and transmits the data of the approximation to a client computer system via a network. The client may receive, over a network, a plurality of data packets, wherein the plurality of data packets collectively corresponds to an approximate representation of graphical data of a virtual computing environment hosted on a second computer system. The network may be a UDP-based network connection. In an embodiment, the data packets correspond to different regions of a graphical user interface which were subsampled and prioritized to determine the approximate representation. For example, a true representation of a host computing environment might include a video-on-demand playback in one region of the screen occurring simultaneously with unrelated user interaction in another portion of the screen (e.g., user typing into a text document). Data for these two regions can be split into different data packets that are transmitted to the remote client at different priorities. For example, the text being typed into the document may be prioritized ahead of the on-demand video. In some cases, additional context can be used to determine whether to buffer or de-prioritize data such as video data. For example, if the video is linked or otherwise associated with another region of the screen there may exist a dependency between those two data packets such that they are assigned the same priority. It should be noted that a representation may, in some cases, refer to a true representation, an approximate representation, or both.

The various embodiments further can be implemented in a wide variety of operating environments, which in some cases can include one or more user computers, computing devices or processing devices which can be used to operate any of a number of applications. In an embodiment, user or client devices include any of a number of computers, such as desktop, laptop or tablet computers running a standard operating system, as well as cellular (mobile), wireless and handheld devices running mobile software and capable of supporting a number of networking and messaging protocols and such a system also includes a number of workstations running any of a variety of commercially-available operating systems and other known applications for purposes such as development and database management. In an embodiment, these devices also include other electronic devices, such as dummy terminals, thin-clients, gaming systems and other devices capable of communicating via a network, and virtual devices such as virtual machines, hypervisors, software containers utilizing operating-system level virtualization and other virtual devices or non-virtual devices supporting virtualization capable of communicating via a network.

In an embodiment, a system utilizes at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and other protocols. The network, in an embodiment, is a local area network, a wide-area network, a virtual private network, the Internet, an intranet, an extranet, a public switched telephone network, an infrared network, a wireless network, a satellite network, and any combination thereof. In an embodiment, a connection-oriented protocol is used to communicate between network endpoints such that the connection-oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In an embodiment, the system utilizes a web server that run one or more of a variety of server or mid-tier applications, including Hypertext Transfer Protocol ("HTTP") servers, FTP servers, Common Gateway Interface ("CGI") servers, data servers, Java servers, Apache servers, and business application servers. In an embodiment, the one or more servers are also capable of executing programs or scripts in response to requests from user devices, such as by executing one or more web applications that are implemented as one or more scripts or programs written in any programming language, such as Java®, C, C# or C++, or any scripting language, such as Ruby, PHP, Perl, Python or TCL, as well as combinations thereof. In an embodiment, the one or more servers also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. In an embodiment, a database server includes table-based servers, document-based servers, unstructured servers, relational servers, non-relational servers, or combinations of these and/or other database servers.

In an embodiment, the system includes a variety of data stores and other memory and storage media as discussed above which can reside in a variety of locations, such as on a storage medium local to (and/or resident in) one or more of the computers or remote from any or all of the computers across the network. In an embodiment, the information resides in a storage-area network ("SAN") familiar to those skilled in the art and, similarly, any necessary files for performing the functions attributed to the computers, servers or other network devices are stored locally and/or remotely, as appropriate. In an embodiment where a system includes computerized devices, each such device can include hardware elements that are electrically coupled via a bus, the elements including, for example, at least one central processing unit ("CPU" or "processor"), at least one input device (e.g., a mouse, keyboard, controller, touch screen, or keypad), at least one output device (e.g., a display device, printer, or speaker), at least one storage device such as disk drives, optical storage devices, and solid-state storage devices such as random access memory ("RAM") or read-only memory ("ROM"), as well as removable media devices, memory cards, flash cards, etc., and various combinations thereof.

In an embodiment, such a device also includes a computer-readable storage media reader, a communications device (e.g., a modem, a network card (wireless or wired), an infrared communication device, etc.), and working memory as described above where the computer-readable storage media reader is connected with, or configured to receive, a computer-readable storage medium, representing remote, local, fixed, and/or removable storage devices as well as storage media for temporarily and/or more permanently containing, storing, transmitting, and retrieving computer-readable information. In an embodiment, the system and various devices also typically include a number of software applications, modules, services, or other elements located within at least one working memory device, including an operating system and application programs, such as a client application or web browser. In an embodiment, customized hardware is used and/or particular elements are implemented in hardware, software (including portable software, such as applets), or both. In an embodiment, connections to other computing devices such as network input/output devices are employed.

In an embodiment, storage media and computer readable media for containing code, or portions of code, include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members.

Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood with the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, a non-transitory computer-readable storage medium store instructions and a main CPU execute some of the instructions while a graphics processor unit executes other instructions. In an embodiment, different components of a computer system have separate processors and different processors execute different subsets of the instructions.

Accordingly, in an embodiment, computer systems are configured to implement one or more services that singly or collectively perform operations of processes described herein and such computer systems are configured with applicable hardware and/or software that enable the performance of the operations. Further, a computer system that implement an embodiment of the present disclosure is a single device and, in another embodiment, is a distributed computer systems comprising multiple devices that operate differently such that the distributed computer system performs the operations described herein and such that a single device does not perform all operations.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method, comprising:
   collecting a set of data that corresponds to a graphical representation of a computing environment;
   determining a plurality of subsets of the set of data, wherein a subset of the plurality has mathematical continuity determined based on a correlation coefficient calculated from at least a portion of data elements of the subset exceeding a threshold value;
   compressing at least the subset of the plurality, thereby generating one or more compressed subsets; and
   providing the one or more compressed subset to another computing entity, wherein the compressed subset is usable to determine the graphical representation of the computing environment, wherein the graphical representation is presentable to a consumer of the other computing entity.

2. The computer-implemented method of claim 1, wherein the graphical representation of the computing environment is a remote desktop under control of the other computing entity via a network.

3. The computer-implemented method of claim 1, wherein a first subset and a second subset include interlaced graphical data.

4. The computer-implemented method of claim 1, wherein the one or more compressed subsets each are independently parsable.

5. A system, comprising:
one or more processors; and
memory that stores computer-executable instructions executable to cause the one or more processors to:
obtain a set of data comprising information to be used to generate a representation;
process the set of data to obtain a plurality of subsets with continuity indicated by correlation between a first subset of the plurality to a second subset of the plurality, wherein the first subset of the plurality lacks a dependency to the second subset of the plurality;
compress the plurality of subsets of the set of data to generate a plurality of compressed subsets; and
transmit the plurality of compressed subsets, wherein the plurality of compressed subsets comprises data sufficient to generate at least a portion of the representation based, at least in part, on the plurality of compressed subsets.

6. The system of claim 5, wherein the instructions to process the set of data to obtain the plurality of subsets with continuity include instructions executable to cause the one or more processors to calculate a correlation coefficient for data elements of a subset of the plurality that exceeds a threshold value.

7. The system of claim 5, wherein the instructions that transmit the plurality of compressed subsets include instructions executable to cause the one or more processors to transmit the plurality of compressed subsets using a user datagram protocol (UDP) communications channel.

8. The system of claim 5, wherein:
the set of data comprises graphical data of a graphical user interface (GUI);
the first subset comprises graphical data corresponding to state information associated with an input source of the GUI; and
the instructions include instructions executable to further cause the one or more processors to, as a result of obtaining a response indicating receipt of the first subset by a second system, transmit a third subset comprising updated state information associated with the input source, wherein the third subset omits state information included in the first subset.

9. The system of claim 8, wherein the instructions include instructions executable to further cause the one or more processors to, contingent upon lacking an indication that the second system received the first subset, further cause the one or more processors to transmit a fourth subset comprising updated state information associated with the input source and encoding at least a portion of data from the first subset.

10. The system of claim 5, wherein:
the set of data comprises text captured from an input device;
the first subset comprises a first portion of the captured text; and
the instructions include instructions executable to further cause the one or more processors to:
obtain a response indicating receipt of the first subset by a second system; and
based on the response, transmit a subsequent portion of the captured text.

11. The system of claim 5, wherein the instructions to transmit the plurality of compressed subsets include instructions executable to cause the one or more processors to transmit the plurality of compressed subsets using a communications protocol that lacks an assurance of total sequential completeness.

12. The system of claim 5, wherein the instructions to process the set of data to obtain the plurality of subsets with continuity include instructions executable to cause the one or more processors to identify a first region of an image corresponding to the first subset and a second region of the image corresponding to the second subset, wherein the first region and second region are non-contiguous.

13. A non-transitory computer-readable storage medium comprising executable instructions that, as a result of being executed by one or more processors of a computer system, cause the computer system to at least:
obtain a set of data to be used to generate a graphical representation;
subsample the set of data to identify two or more subsets of the set of data, the two or more subsets determined to have at least a threshold amount of correlation, wherein a first subset of the two or more subsets lacks a dependency to a second subset of the two or more subsets;
compress the two or more subsets to generate two or more compressed subsets; and
transmit the two or more compressed subsets, wherein the two or more compressed subsets comprise data to generate at least a portion of the graphical representation based, at least in part, on the one or more compressed subsets.

14. The non-transitory computer-readable storage medium of claim 13, wherein the set of data includes a virtual desktop computing environment that can be controlled via a second system.

15. The non-transitory computer-readable storage medium of claim 13, wherein the set of data includes graphical data and the instructions further include instructions that, as a result of execution by the one or more processors, cause the computer system to identify regions of graphical data with a correlation coefficient that exceeds a threshold value.

16. The non-transitory computer-readable storage medium of claim 13, wherein the instructions that transmit the two or more compressed subsets include instructions that, as a result of execution by the one or more processors, cause the system to transmit the two or more compressed subsets using a communications channel that provides assurances of local sequential completeness.

17. The non-transitory computer-readable storage medium of claim 13, wherein the instructions further include instructions that, as a result of execution by the one or more processors, further cause the computer system to:
generate a forward error correction (FEC) code based on at least a portion of the two or more subsets; and
transmit the FEC code to a second system.

18. The non-transitory computer-readable storage medium of claim 13, wherein the computer system is at least a portion of a computing resource service provider and transmits the two or more compressed subsets to a second system that is a client of the computing resource service provider, the second system comprising an output device for presenting the representation of the set of data to a consumer.

19. The non-transitory computer-readable storage medium of claim 13, wherein representation of a first subset of the set of data is independent from representation of a second subset of the set of data.

20. The non-transitory computer-readable storage medium of claim 18, wherein the set of data is presentable to two or more other clients of the computing resource service provider.

* * * * *